US008437177B2

(12) United States Patent
Katoh

(10) Patent No.: US 8,437,177 B2
(45) Date of Patent: May 7, 2013

(54) NONVOLATILE LATCH CIRCUIT AND NONVOLATILE FLIP-FLOP CIRCUIT

(75) Inventor: Yoshikazu Katoh, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/516,875

(22) PCT Filed: Jan. 19, 2012

(86) PCT No.: PCT/JP2012/000328
§ 371 (c)(1),
(2), (4) Date: Jun. 18, 2012

(87) PCT Pub. No.: WO2012/098897
PCT Pub. Date: Jul. 26, 2012

(65) Prior Publication Data
US 2012/0280713 A1    Nov. 8, 2012

(30) Foreign Application Priority Data

Jan. 20, 2011   (JP) ................................. 2011-010284

(51) Int. Cl.
*G11C 11/00* (2006.01)

(52) U.S. Cl.
USPC ................ 365/154; 365/156; 326/46; 326/38

(58) Field of Classification Search ........................ None
See application file for complete search history.

(56) References Cited

U.S. PATENT DOCUMENTS

| | | | |
|---|---|---|---|
| 6,639,834 B2 | 10/2003 | Sunaga et al. | |
| 6,862,226 B2 | 3/2005 | Toyoda et al. | |
| 7,184,297 B2 | 2/2007 | Yasuda et al. | |
| 7,221,600 B2 | 5/2007 | Hara et al. | |
| 7,692,954 B2 * | 4/2010 | Lamorey | 365/154 |
| 7,733,145 B2 | 6/2010 | Abe et al. | |

(Continued)

FOREIGN PATENT DOCUMENTS

| | | |
|---|---|---|
| JP | 2003-16773 | 1/2003 |
| JP | 2003-157671 | 5/2003 |

(Continued)

OTHER PUBLICATIONS

International Search Report issued Feb. 14, 2012 in corresponding International Application No. PCT/JP2012/000328.

(Continued)

*Primary Examiner* — Jany Richardson
(74) *Attorney, Agent, or Firm* — Wenderoth, Lind & Ponack, L.L.P.

(57) ABSTRACT

A nonvolatile latch circuit of the invention includes a variable resistance element which is formed by interposing an oxide layer between electrodes, and changes to a low resistance state by applying a voltage to cause current flow in the direction from the first to the second electrode, and changes to a high resistance state by applying a voltage to cause current flow in the reverse direction, wherein a first terminal of a transistor, a first terminal of other transistor, an output terminal of an inverter circuit, and an output terminal of other inverter circuit are respectively connected to one electrode, the other electrode, a second terminal of the transistor, and a second terminal of the other transistor, and a current flowing through the variable resistance element when changed to a low resistance state is smaller in absolute value than a current therethrough when changed to a high resistance state.

13 Claims, 21 Drawing Sheets

U.S. PATENT DOCUMENTS

| | | | |
|---|---|---|---|
| 7,791,941 B2 * | 9/2010 | Hanafi | 365/185.08 |
| 7,903,451 B2 | 3/2011 | Yamada et al. | |
| 8,022,502 B2 | 9/2011 | Kanzawa et al. | |
| 8,194,438 B2 * | 6/2012 | Ahn et al. | 365/158 |
| 2002/0181275 A1 | 12/2002 | Sunaga et al. | |
| 2004/0257113 A1 | 12/2004 | Toyoda et al. | |
| 2006/0023488 A1 | 2/2006 | Yasuda et al. | |
| 2006/0028247 A1 | 2/2006 | Hara et al. | |
| 2006/0083047 A1 | 4/2006 | Fujita et al. | |
| 2007/0041242 A1 * | 2/2007 | Okazaki et al. | 365/154 |
| 2008/0080231 A1 | 4/2008 | Abe et al. | |
| 2008/0123393 A1 | 5/2008 | Kinoshita | |
| 2008/0298117 A1 * | 12/2008 | Hamada et al. | 365/156 |
| 2009/0283736 A1 | 11/2009 | Kanzawa et al. | |
| 2010/0073991 A1 | 3/2010 | Yamada et al. | |
| 2010/0207094 A1 | 8/2010 | Kanzawa et al. | |
| 2010/0238712 A1 * | 9/2010 | Xi et al. | 365/148 |
| 2011/0294259 A1 | 12/2011 | Kanzawa et al. | |

FOREIGN PATENT DOCUMENTS

| | | |
|---|---|---|
| JP | 2004-273099 | 9/2004 |
| JP | 2006-48739 | 2/2006 |
| JP | 2008-85770 | 4/2008 |
| JP | 4367281 | 11/2009 |
| JP | 2010-79988 | 4/2010 |
| WO | 2004/040582 | 5/2004 |
| WO | 2006/137111 | 12/2006 |
| WO | 2008/149484 | 12/2008 |
| WO | 2009/050833 | 4/2009 |
| WO | 2009/060625 | 5/2009 |

OTHER PUBLICATIONS

Wei Wang et al., "Nonvolatile SRAM Cell", IEEE 2006, 1-4244-0439-8: 10.1109/IEDM.2006.346730, Dec. 11-13, 2006.

* cited by examiner

Voltage application condition A

Voltage application condition B

Case where parasitic capacitance C2 of node 4
> parasitic capacitance C1 of node 3

Case where parasitic capacitance C2 of node 4
≤ parasitic capacitance C1 of node 3

Case where there is no constraint on relationship between parasitic capacitance C2 of node 4 and parasitic capacitance C1 of node 3

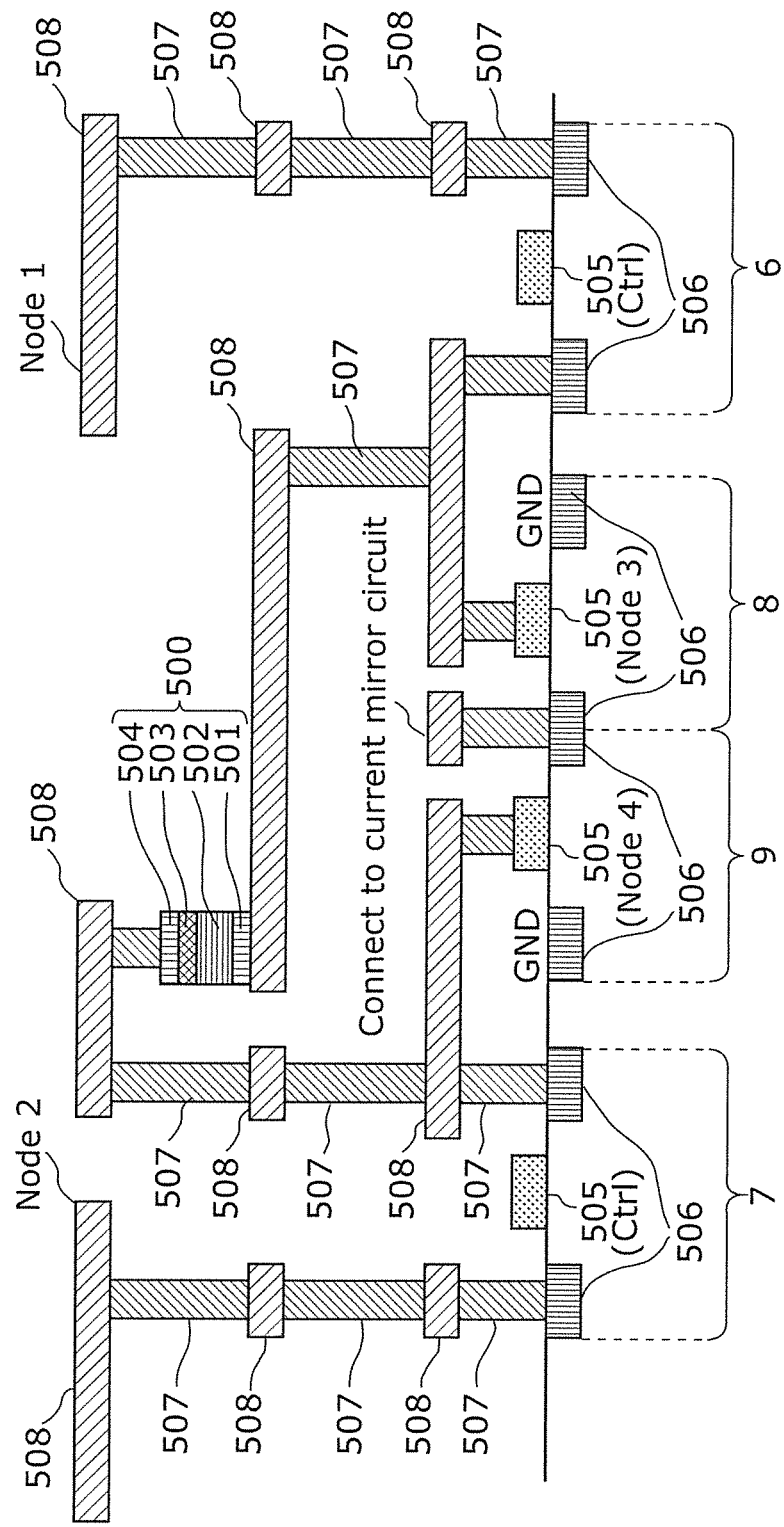

| Ctrl | TMG2 | SET | ReSET | Q | QB |
|---|---|---|---|---|---|
| 0 | Off | 1 | 0 | 0 | 1 |
| | | 0 | 1 | 1 | 0 |
| | | 1 | 1 | Qn - 1 | QBn - 1 |
| | | 0 | 0 | Undefined | |
| Vw | 1 | 1 | Qn - 1 Stored | QBn - 1 Stored | |
| Vr | On | | | Qn - 1 Restored | QBn - 1 Restored |

FIG. 18B

| Ctrl | TMG2 | SET | ReSET | Q | QB |
|---|---|---|---|---|---|
| 0 | Off | 1 | 0 | 1 | 0 |
| | | 0 | 1 | 0 | 1 |
| | | 0 | 0 | Qn - 1 | QBn - 1 |
| | | 1 | 1 | Undefined | |
| Vw | | 0 | 0 | Qn - 1 Stored | QBn - 1 Stored |
| Vr | On | | | Qn - 1 Restored | QBn - 1 Restored |

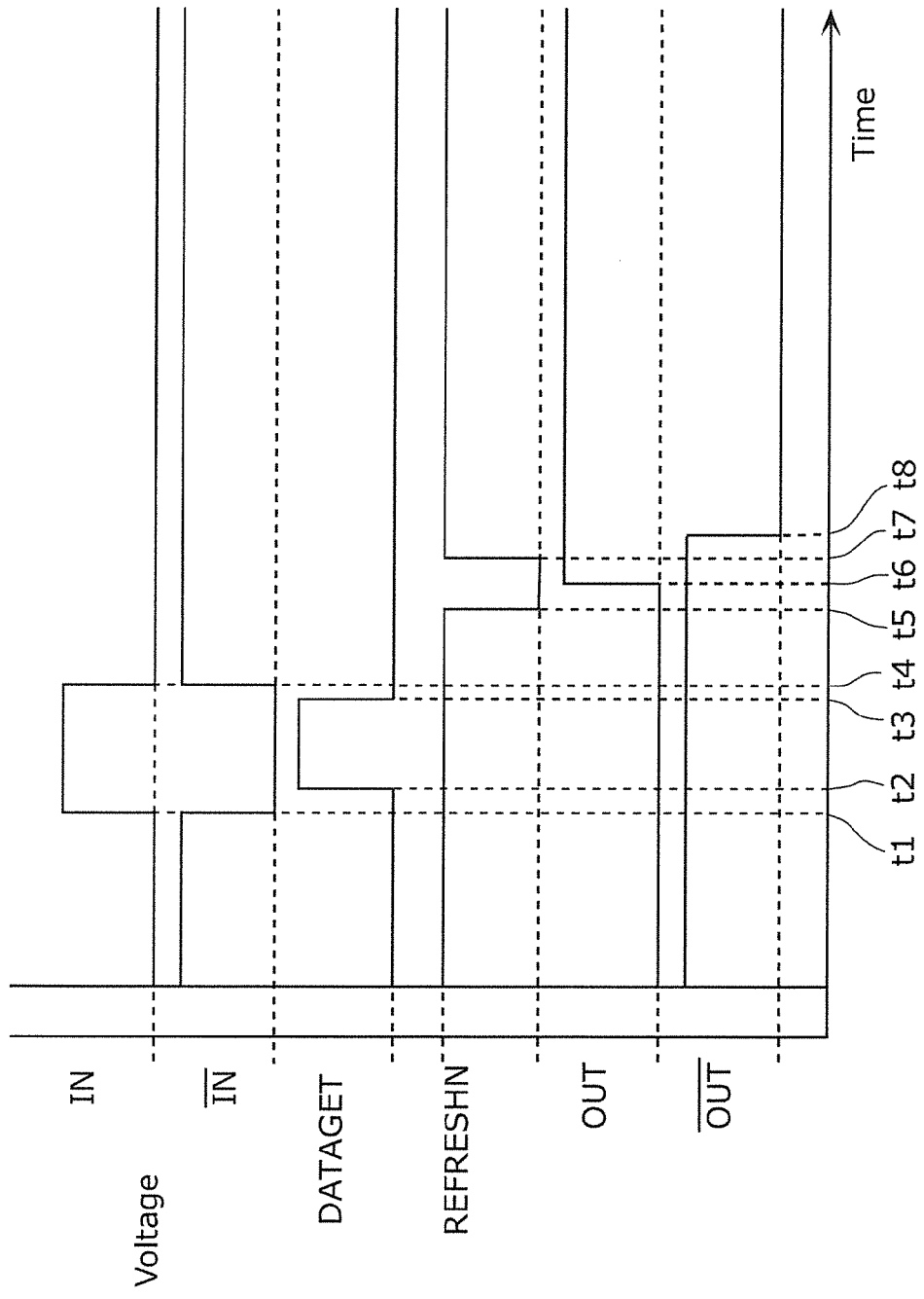

NONVOLATILE LATCH CIRCUIT AND NONVOLATILE FLIP-FLOP CIRCUIT

TECHNICAL FIELD

The present invention relates to a nonvolatile latch circuit and a nonvolatile flip-flop circuit. Particularly, the present invention relates to a nonvolatile digital signal processing device which can restore a state of signal processing before a power supply is turned off, by a nonvolatile latch circuit restoring the state of the nonvolatile latch circuit which holds the state even when the power supply is turned off.

BACKGROUND ART

A great number of microcomputers and logic LSIs which include a digital circuit are used in electronic products.

In a digital circuit such as a microcomputer or an LSI, a latch circuit which temporarily holds digital signals for intermediate processed content, or a register circuit (hereinafter, collectively referred to as simply latch circuit) such as a flip-flop which stores one bit of digital information is used on a signal processing path. The latch circuit holds two states, high (H) and low (L) of a digital signal. As the simplest circuit configuration, a circuit configuration (pair inverter) in which two inverter circuits are combined as a pair and mutually cross-connected to each other can be illustrated. In addition, a set-reset flip-flop (SR-FF) circuit in which two NAND circuits or two NOR circuits are combined as a pair and mutually cross-connected to each other, and an edge-triggered D flip-flop (D-FF) circuit in which a plurality of SR-FF circuits are combined, and the logic state of the output is updated in synchronization with clock edges can be also illustrated. Because these circuits are very ordinary known art, their detailed description is omitted. The operation speeds of the circuits are each determined by a turn-on time and a turn-off time of a transistor. Particularly, in an example of a latch circuit using the above-mentioned pair inverter, the operation speed is limited only by the switching speed of a C-MOS (Complementary-MOS) circuit including four MOSFETs (Metal Oxide Semiconductor Field Effect Transistor), and thus circuit operation on the order of nano seconds can be achieved.

However, once the power source to the latch circuits is turned off, the state of each latch circuit is not held but is lost (volatile). In the case of a nonvolatile latch circuit in which the logic states of all latch circuits in a logic circuit are stored regardless of whether the power source is in ON state or OFF state, the logic states immediately before the turning off of the power source can be quickly restored when the power source is turned on again. Thus even when the power source for an electronic device is turned off by a user, the previous states can be fully restored when the power source is turned on again, thereby allowing continuous circuit operation without returning to the initial state.

Although power saving LSIs have been developed along with the progress of finer semiconductor process, steering of leakage current has become difficult because of the progress, and thus the power saving LSIs in use of only finer semiconductor process are approaching the limit. For this reason, an approach to improving power saving is being adopted by elaborately controlling turning ON/OFF of the power source per circuit block within an LSI for unused circuit blocks. However, when the power source for a block is turned off, the logic state of the block is lost, and thus the approach cannot be performed on a circuit block for which continuous processing is needed. To the contrary, in the case where the above-described nonvolatile latch circuit constitutes all of the registers and latch circuits in a logic circuit, a request for the continuous processing can be satisfied.

However, as an example of application to an LSI of a nonvolatile latch circuit in the conventional art, a floating gate memory element (hereinafter referred to as a flash memory) is utilized as a program recording memory of FPGA (Field-Programmable Gate Arrays) or FPLD (Field-Programmable Logic Devices), and thus the application is limited to a memory area formed as a separate area from a logic circuit. This is because erasing or writing information of or to a flash memory needs a time of the order of μs, and thus the duty cycle of the flash memory cannot be synchronized with the duty cycle of the logic circuit. In the case where such a memory is individually installed in each latch circuit in the logic circuit, even when an operation of each latch circuit is completed, recording of information (logic state of the latch circuit) to the memory is not completed, and thus high-speed operation performance of the logic circuit is impaired. Consequently, in order to ensure high-speed operation of the logic circuit, the following processing is necessary: a flash memory is provided separately from the logic circuit; before the power source is turned off, the state in the logic circuit is transferred to the flash memory; and when the transfer is completed the power source is turned off. However, there is a problem in that in the case of a sudden power off, all the latch states in the logic circuit cannot be transferred to the flash memory in time, and thus the recording cannot be completed. The voltage required for writing or erasing of a flash memory is generally substantially higher than the power source voltage of a logic circuit. Therefore, a write operation to the flash memory cannot be directly performed based on an output signal of the logic circuit. Consequently, the writing or erasing voltage of a flash memory needs to be supplied from the outside of an LSI or be generated inside the LSI chip, and a dedicated driver circuit is necessary.

Furthermore, the manufacturing process of flash memory is complicated in general, and thus forming the logic circuit and the flash memory on the same substrate makes the process even more complicated. In addition, after the transistors that constitute the logic circuit are formed, high-heat process or the like is involved, and therefore the performance of the transistors may be impaired.

In order to cope with these problems, in recent years, the following proposals have been made to configure a nonvolatile latch circuit.

[First Conventional Embodiment]

First, as a first conventional embodiment, a nonvolatile latch circuit using a spin valve memory element as disclosed in PTL 1 is described. The spin valve memory element is also referred to as an MRAM (Magnetic Random Access Memory) cell, which is a memory element using Magneto Resistive Effect in which a resistance value changes in accordance with a magnetization direction. As the Magneto Resistive Effect, Anisotropic Magnetoresistance (AMR), Giant Magnetoresistance (GMR), and Tunnel Magnetoresistance (TMR) are known.

FIG. 19A is a circuit configuration diagram of a nonvolatile latch circuit according to the first conventional embodiment. FIG. 19B is an operation timing chart of the nonvolatile latch circuit according to the first conventional embodiment. A nonvolatile latch circuit 600 illustrated FIG. 19A includes a sense latch circuit 601 and a write current generation circuit 602.

The sense latch circuit 601 includes an inverter circuit 611 which includes a p-type MOSFET 621 and an n-type MOSFET 622, an inverter circuit 612 which includes a p-type MOSFET 623 and an n-type MOSFET 624, p-type MOSFETs 625 and 626, an n-type MOSFET 627, and magnetoresistive elements MTJ0 and MTJ1. The write current generation circuit 602 has n-type MOSFETs 628 to 632.

In FIG. 19A, a data signal is inputted to IN terminal, and an inverted signal of the data inputted to IN terminal is inputted to IN (with an upper bar) terminal. In this state, when DATAGET terminal is set from "L" to "H" for a predetermined time period, as illustrated in FIG. 19B, the n-type MOSFET 632 is turned on, and a current i flows to DWL in a direction according to the input data. Accordingly, the resistances of the magnetoresistive elements MTJ0 and MTJ1 change, and one of them changes to a high resistance state and the other changes to a low resistance state. Subsequently, when REFRESHN terminal is set from "H" to "L" for a predetermined time period, the n-type MOSFET 627 is turned OFF, and the p-type MOSFETs 625 and 626 are turned ON. Accordingly, a node n1 and a node n2 are temporarily precharged to Vdd. The REFRESHN terminal is then set to "H" again, and the n-type MOSFET 627 is turned ON, and thus a current flows to GND via the magnetoresistive elements MTJ0 and MTJ1. The potentials of the node n1 and the node n2 gradually approach the GND potential because of the current. In this process, one of the magnetoresistive elements MTJ0 and MTJ1 that has less resistance value is discharged earlier and the corresponding node potential is reduced earlier. Consequently, the logic of a pair inverter circuit which includes the inverter circuits 611 and 612 converges, and the latch circuit is restored to the logic state according to the resistance relationship between the magnetoresistive elements MTJ0 and MTJ1.

Like this, PLT 1 states the effect that a nonvolatile latch circuit and a flip-flop circuit can be individually disposed in a logic circuit thanks to the nonvolatile latch circuit 600 using a magnetoresistive element, and the operation speed of the entire logic circuit is not impaired because high-speed rewrite to the magnetoresistive element is possible. PLT 1 also discloses that a high voltage which is different from the voltage necessary for a logic operation in rewriting to a memory element is unnecessary.

[Second Conventional Embodiment]

Next, as a second conventional embodiment, a nonvolatile latch circuit using a ReRAM (Resistive RAM) cell as disclosed in PLT1 is described. The ReRAM cell is a variable resistance element whose resistance value changes by application of an electrical stress (mainly electrical pulse). PLT 1 discloses an element in which a resistance film comprising ZnCdS is interposed between a silver (Ag) electrode and a platinum (Pt) electrode. The variable resistance element in this conventional embodiment changes to a high resistance state under application of a voltage which causes a current to flow from BE (Pt) electrode to TE (Ag) electrode, and exceeds a predetermined voltage level, or changes to a low resistance state under application of a voltage which causes a current to flow from TE (Ag) electrode to BE (Pt) electrode, and exceeds a predetermined voltage level. A nonvolatile latch circuit is configured by connecting the element as illustrated in FIG. 20.

FIG. 20 is a circuit configuration diagram of a nonvolatile latch circuit according to a second conventional embodiment. A nonvolatile latch circuit 700 illustrated in FIG. 20 includes variable resistance elements 711 and 712. The variable resistance element 711 and the variable resistance element 712 must be reset in a high resistance state. In a latch operation at normal operation time, Vctrl is pulled up to Vdd, and the variable resistance elements 711 and 712 are already in a high resistance state regardless of whether BL and BL_B is at the GND level or the Vdd level, and thus no resistance change occurs, and a normal latch operation is performed. Next, when the logic state of the latch circuit is stored in the variable resistance element, Vctrl is set to the GND level for a predetermined time period. Accordingly, the variable resistance element between BL and BL_B that is connected to "H" side changes to a low resistance state. The logic information of the latch circuit which has been stored as a low resistance state is restored in such a manner that when Vctrl is pulled up to Vdd, one of the variable resistance elements which is in a low resistance state is increased in potential earlier than the other variable resistance element, and consequently the side to which the variable resistance element in a low resistance state is connected converges to "H", and the other side converges to "L."

In order to return to normal latch operation, it is necessary to reset the variable resistance element in a low resistance state to a high resistance state by increasing the potential of Vctrl terminal higher than Vdd because power consumption increases when a variable resistance element is in a low resistance state.

Thus, according to the example disclosed in PLT 1, a nonvolatile latch circuit can be achieved only by adding two variable resistance elements, and the speed of a normal latch operation is not impaired at all.

[Third Conventional Embodiment]

Next, as a third conventional embodiment, a nonvolatile latch circuit using a ReRAM cell disclosed in PLT 2 and PLT 3 is described.

FIG. 21 is a circuit image diagram illustrating a method of storing the state of a nonvolatile latch circuit according to the third conventional embodiment into a variable resistance element. FIG. 22 is a circuit diagram illustrating a method of restoring the previous latch state based on a resistance state stored in the variable resistance element in the nonvolatile latch circuit according to the third conventional embodiment. In the third preceding embodiment, two variable resistance elements are used as a pair for storing a latch state. A nonvolatile latch circuit 800 illustrated in FIG. 21 is a cross-coupled latch circuit such that an output terminal of an inverter circuit 821 is connected to an input terminal of an inverter circuit 822, and an output terminal of the inverter circuit 822 is connected to an input terminal of the inverter circuit 821. A variable resistance element 811 and a variable resistance element 812 are connected via node x and node y by switching a switch circuit (not shown).

When the nonvolatile latch circuit 800 has a state in which the node x in a High level and the node y is in a Low level, a current flows through the variable resistance elements 811 and 812 in the direction indicated by a voltage application direction A. Then the variable resistance element 811 changes to a state (referred to as HR state, or simply HR) in which a resistance value is high, and the variable resistance element 812 changes to a state (referred to as LR state, or simply LR) in which a resistance value is low.

When the nonvolatile latch circuit 800 has a state in which the node y in a High level and the node x is in a Low level, a current flows through the variable resistance elements 811 and 812 in the direction indicated by a voltage application direction B. Then the variable resistance element 811 changes to LR state and the variable resistance element 812 changes to HR state, and the states of the latch circuits are stored in the respective variable resistance elements.

On the other hand, by switching a switch circuit (not shown), the variable resistance elements 811 and 812 are connected to the power source lines of the inverter circuits 821 and 822 as illustrated in FIG. 22. In this circuit connection, in the case where the variable resistance element 811 is in HR and the variable resistance element 812 is in LR, when the power supply terminal A illustrated in FIG. 22 is pulled up from 0V to the power source voltage VDD, the current flowing through the inverter circuit 821 is reduced, and the current flowing through the inverter circuit 822 is increased. Accordingly, the output of the inverter circuit 821 rises up earlier than the output of the inverter circuit 822, and thus the node y is set to a High level, and the node x approaches a Low level so that the previous latch state is restored. Conversely, in the case where the variable resistance element 811 is in LR and the variable resistance element 812 is in HR, the current flowing through the inverter circuit 821 is increased, and the current flowing through the inverter circuit 822 is reduced. Accordingly, the output of the inverter circuit 822 rises up earlier than the output of the inverter circuit 821, and thus the node x is set to a High level, and the node y approaches a Low level so that the previous latch state is restored.

Thus, according to the configuration of the third conventional embodiment, an effect is obtained that the speed of a normal latch operation is not impaired at all even when a variable resistance element is separated from the latch circuit using a switch circuit. In addition, another effect is obtained that the durability of each variable resistance element can be significantly improved because after a resistance state is read from each variable resistance element, a voltage for causing the previous latch state to be restored is small, and a voltage stress is not applied to the variable resistance element after the restoring.

PTL 4 discloses the characteristic of the cellular structure of a variable resistance element, that is to say, the direction of voltage application and the direction of resistance change are determined as a consequence of configuring the oxide layers included in the variable resistance element in a stacked structure of a first oxide layer having a first oxygen content atomic percentage, and a second oxide layer having an oxygen content atomic percentage which is higher than that of the first oxide layer. PTL 5 discloses that the direction of voltage application and the direction of resistance change are determined as a consequence of utilizing two electrode materials whose standard electrode potentials are respectively high and low, the materials being used for the variable resistance element.

PTL 6 discloses that a load resistance is connected to a variable resistance element in series, and the load characteristic of the load resistance is switched in accordance with whether a change is made to LR state or HR state, where the load resistance for a change to LR state is set to be greater than the load resistance for a change to HR state so that it is necessary in some cases to limit the current for a change to LR state in order to achieve stable resistance change operation of a variable resistance element.

[Citation List]
[Patent Literature]
[PTL 1] Japanese Unexamined Patent Application Publication No. 2003-157671
[PTL 2] Japanese Unexamined Patent Application Publication No. 2008-85770
[PTL 3] WO 2009/060625
[PTL 4] WO 2008/149484
[PTL 5] WO 2009/050833
[PTL 6] WO 2006/137111
[Non Patent Literature]
[NPL 1] "Nonvolatile SRAM Cell", IEEE 2006, 1-4244-0439-8/06

SUMMARY OF INVENTION

Technical Problem

However, in the nonvolatile latch circuit of PTL 1 quoted as the first conventional embodiment, high-speed operation is described as an effect, the speed of circuit operation is lower than that of a normal logic circuit because not only a switching delay of a MOSFET occurs between data input and data output, but also write and read operations to and from a magnetoresistive element are performed. Furthermore, because written information is read from an element, a glitch in which OUT and its inversion OUT (with an upper bar) are both set to "H" level may occur. Such a glitch may cause a malfunction once a logic circuit with synchronized clock is formed, and thus is undesirable. In addition, time division control is necessary, which uses 2 control lines for DATAGET which is a control signal for writing data, and REFRESHN which is a control signal for outputting (reading) data, and thus time allowance for DATAGET and REFRESHN operations needs to be considered, thereby preventing high-speed operation. Furthermore, rewriting to the variable resistance element is performed for each latch operation, and thus there is a concern that life of the variable resistance element may be reduced because of decreased durability for rewriting.

In the nonvolatile latch circuit of PTL 1 quoted as the second conventional embodiment, high-speed operation which is determined by the switching speed of transistors is possible because a circuit element for nonvolatile function has absolutely no influence on a normal latch operation. However, in order to store the state of the latch circuit, it is necessary to perform not only writing of the state to a variable resistance element, and a restore operation for reading the state from the variable resistance element, but also a reset operation for causing all variable resistance elements to change to a high resistance state. In the configuration where data input lines are pulled up by the variable resistance element, data input lines are inserted in the signal lines of all the latch circuits, and a current flows constantly through the data input lines, and thus there is a concern about an increase of power consumption. In order to perform reset operations for a great number of latch circuits at once, a powerful driver circuit is needed, which applies a voltage to a plurality of variable resistance elements in a low resistance state, and causes a current to flow through the variable resistance elements. Furthermore, in a normal latch operation, a voltage of Vdd is constantly applied to a variable resistance element connected to an input terminal at "L" level, and therefore an extremely high stress continues to be applied to the variable resistance element. In general, in a variable resistance element, for example, when a high resistance change voltage continues to be applied, the variable resistance element gradually changes to a higher resistance state than before. Accordingly, even when a voltage for changing the variable resistance element to a low resistance is applied thereto subsequently, the variable resistance element is not likely to change to a low resistance state, that is to say, so-called resistance state imprinting phenomenon occurs In the latch circuit of PTL 2 and PTL 3 that are quoted as the third conventional embodiment, two variable resistance elements connected in series need to be rewritten, and thus as an application voltage, a voltage obtained by adding a voltage for changing to HR to a voltage for changing to LR is needed, thereby causing an adverse effect, such as an increase in the power source voltage of the latch circuit, and an increase in the number of the power source generation circuits. In a restore operation, when a plurality of latch circuits is powered on simultaneously in order to utilize the transient response in the power on, there is a concern that the power source voltage may be disturbed, which prevents stable restore operation.

Although current limiting needs to be performed in accordance with the direction of rewriting of a variable resistance element as shown in PLT 6 depending on the type of the variable resistance element, there is no precedence example in which a specific solution is proposed for current limiting in a resistance change operation in a nonvolatile latch circuit using a variable resistance element. Particularly, in the case of the above-described third conventional embodiment, the amount of voltage distributed to the variable resistance element in HR state is more than the amount of voltage distributed to the other variable resistance element between the two variable resistance elements connected in series. For example, when the variable resistance element 811 is in HR state, and the variable resistance element 812 is in LR state in FIG. 21, most of applied voltage component is allocated to the variable resistance element 811 initially. When the variable resistance element 811 starts to change to LR state, part of the voltage component is distributed to the variable resistance element 812 accordingly. However, while the part of the voltage component is distributed to the variable resistance element 812, the voltage across both ends of the variable resistance element 811 reduces quickly, and a resistance change of the variable resistance element 811 may be interrupted before reaching normal LR state. That is to say, when one variable resistance element changes from HR state to LR state, the other variable resistance element in LR state serves as a load resistance, and the resistance change to LR state may become unstable because the load resistance of the other variable resistance element also changes.

In summary, any of the above-described conventional embodiment has a problem in increasing the speed of latch operation, expanding the life of the variable resistance element, or reducing and stabilizing the operating voltage, and thus the above problems cannot be solved at the same time.

The present invention has been conceived in view of the above-mentioned problems, and it is an object of the invention to provide a nonvolatile latch circuit and a nonvolatile flip-flop circuit which are able to perform storing and restoring of the state of a latch in a stable manner with a high speed and high reliability.

Solution to Problem

In order to solve the aforementioned problems, a nonvolatile latch circuit according to one aspect of the present invention is a nonvolatile latch circuit including: a first logic inversion circuit; a second logic inversion circuit having an input terminal connected to an output terminal of the first logic inversion circuit and an output terminal connected to an input terminal of the first logic inversion circuit; a first transistor which includes a first terminal, a second terminal, and a first control terminal, and controls a conduction state between the first terminal and the second terminal in accordance with a voltage of the first control terminal; a second transistor which includes a third terminal, a fourth terminal, and a second control terminal, and controls a conduction state between the third terminal and the fourth terminal in accordance with a voltage of the second control terminal; and a variable resistance element having a structure in which an oxide layer including an oxygen-deficient transition metal oxide is interposed between first and second electrodes, wherein the first terminal of the first transistor and the first electrode of the variable resistance element are connected to each other via a first node, the fourth terminal of the second transistor and the second electrode of the variable resistance element are connected to each other via a second node, the output terminal of the first logic inversion circuit and the second terminal of the first transistor are connected to each other via a third node, and the output terminal of the second logic inversion circuit and the third terminal of the second transistor are connected to each other via a fourth node, the variable resistance element changes to a first resistance state under application of a voltage higher than a first predetermined voltage between the first electrode and the second electrode so as to cause a current to flow in a direction from the first electrode to the second electrode, and changes to a second resistance state having a resistance value larger than a resistance value of the first resistance state under application of a voltage higher than a second predetermined voltage between the first electrode and the second electrode so as to cause a current to flow in a direction from the second electrode to the first electrode, and an absolute value of a first current that flows through the variable resistance element when the variable resistance element is caused to change from the second resistance state to the first resistance state is smaller than an absolute value of a second current that flows through the variable resistance element when the variable resistance element is caused to change from the first resistance state to the second resistance state.

Advantageous Effects of Invention

According to the configuration of the present invention, a nonvolatile latch circuit and a nonvolatile flip-flop circuit can be arbitrarily disposed in a logic circuit. The operation speed of the entire logic circuit to which the nonvolatile latch circuit and nonvolatile flip-flop circuit of the present invention are applied is only limited by the switching performance of the relevant transistors, and is not impaired at all by adding a nonvolatile function. When logic state information is recorded on a variable resistance element which is a memory element of a nonvolatile latch circuit or a nonvolatile flip-flop circuit, a high voltage which is used for a flash memory is not necessary.

BRIEF DESCRIPTION OF DRAWINGS

FIG. 12 is a layout diagram for suppressing occurrence of noise in the case where a variable resistance element is used which changes to HR state when a voltage is applied to cause a current to flow in the direction from an upper electrode to a lower electrode.

FIG. 18B is a diagram illustrating a logic table of a nonvolatile flip-flop circuit showing a modification of Embodiment 3 of the present invention.

FIG. 19B is an operation timing chart of the nonvolatile latch circuit according to the first conventional embodiment.

DESCRIPTION OF EMBODIMENTS

Figure 1:
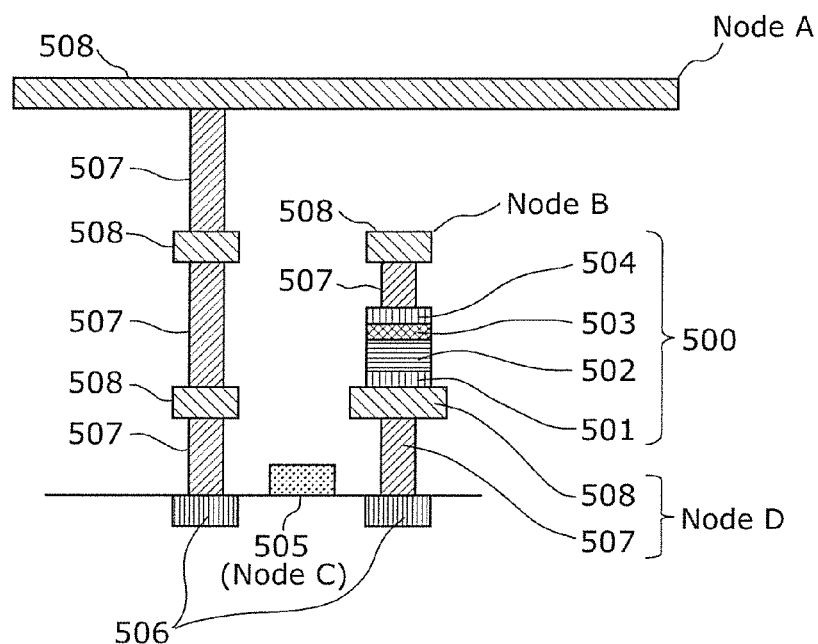
FIG. 1 is an element configuration diagram illustrating an example of the schematic configuration of a variable resistance element having a nonvolatile latch circuit according to Embodiment 1 of the present invention.

Any of the above-described conventional nonvolatile latch circuits cannot solve the following problems at the same time.

Problem 1: the operation speed of each latch operation cannot be as high as the operation speed of a single latch circuit.

Problem 2: the life of each element is short because rewrite to the variable resistance element is performed for each latch operation.

Problem 3: the life of each element is short because voltage application is not made with a voltage value and a time suitable for rewriting or reading.

Problem 4: the rewriting voltage cannot be reduced because a plurality of variable resistance elements are connected in series.

Problem 5: resistance change process is unstable because current limiting is not performed when a resistance changes.

In order to solve the aforementioned problems, a nonvolatile latch circuit according to one aspect of the present invention is a nonvolatile latch circuit including: a first logic inversion circuit; a second logic inversion circuit having an input terminal connected to an output terminal of the first logic inversion circuit and an output terminal connected to an input terminal of the first logic inversion circuit; a first transistor which includes a first terminal, a second terminal, and a first control terminal, and controls a conduction state between the first terminal and the second terminal in accordance with a voltage of the first control terminal; a second transistor which includes a third terminal, a fourth terminal, and a second control terminal, and controls a conduction state between the third terminal and the fourth terminal in accordance with a voltage of the second control terminal; and a variable resistance element having a structure in which an oxide layer including an oxygen-deficient transition metal oxide is interposed between first and second electrodes, wherein the first terminal of the first transistor and the first electrode of the variable resistance element are connected to each other via a first node, the fourth terminal of the second transistor and the second electrode of the variable resistance element are connected to each other via a second node, the output terminal of the first logic inversion circuit and the second terminal of the first transistor are connected to each other via a third node, and the output terminal of the second logic inversion circuit and the third terminal of the second transistor are connected to each other via a fourth node, the variable resistance element changes to a first resistance state under application of a voltage higher than a first predetermined voltage between the first electrode and the second electrode so as to cause a current to flow in a direction from the first electrode to the second electrode, and changes to a second resistance state having a resistance value larger than a resistance value of the first resistance state under application of a voltage higher than a second predetermined voltage between the first electrode and the second electrode so as to cause a current to flow in a direction from the second electrode to the first electrode, and an absolute value of a first current that flows through the variable resistance element when the variable resistance element is caused to change from the second resistance state to the first resistance state is smaller than an absolute value of a second current that flows through the variable resistance element when the variable resistance element is caused to change from the first resistance state to the second resistance state.

With this configuration, a latch operating unit including a logic inversion circuit, and a state storage unit including a transistor and a variable resistance element are electrically separated from each other by setting the potential of the control terminal of each transistor to the ground potential, for example, so that the above latch operating unit can operate independently of the above state storage unit. Thus, the above-described problem 1 is solved, and the operation speed of each latch operation can be as high as the operation speed of a single latch circuit having no state storage unit. When a writing voltage is applied to the control terminal to drive the variable resistance element under the condition of the logic state of the latch circuit such that the third node (node 1) is at a High level, and the fourth node (node 2) is at a Low level, the first transistor serves as a current steering element. When a writing voltage is applied to the control terminal to drive the variable resistance element under the condition that the third node (node 1) is at a High level, and the fourth node (node 2) is at a Low level, the second transistor serves as a current steering element. Consequently, the problem 5 is solved. Because write control can be performed as desired using the control terminal, rewrite to the variable resistance element is not performed for each latch operation, and necessary voltage is applied for a time as needed in rewriting step, and thus stable rewrite operation can be achieved, thereby solving the above-described problem 2 and problem 3. In addition, because a single variable resistance element is used for storing the logic state of each latch circuit, the above-described problem 4 is also solved, and thus the rewriting voltage can be reduced to a minimum voltage in accordance with a variable resistance element to be used.

In addition, in a preferable embodiment, the nonvolatile latch circuit further includes a summing amplifier circuit which detects a value of a sum of a potential of the first node and a potential of the second node, wherein when the variable resistance element changes from the second resistance state to the first resistance state, or changes from the first resistance state to the second resistance state, in the case where a read voltage which is smaller than a first write voltage and a second write voltage in absolute value is applied to the first control terminal and the second control terminal, the summing amplifier circuit outputs a high-level voltage or a low-level voltage which represents a logic state of a latch operating unit including the first and second logic inversion circuits, to the third node or the fourth node in accordance with the value of the sum so as to restore the logic state of the latch operating unit based on a resistance state stored in the variable resistance element, the first write voltage and the second write voltage indicating a voltage applied to the first control terminal and a voltage applied to the second control terminal, respectively.

Accordingly, as described in the third conventional embodiment, a transitional period during which power source start-up is unstable is not used when the previous latch state is restored from the resistance state of the variable resistance element, thus the restore operation of the latch state is stabilized. In addition, because a low voltage which has less stress and is necessary for reading is applied for a time as needed, the problem in reading step in the above-described problem 3 is also solved, and thus extremely stable restore operation can be achieved.

In a preferred embodiment, the nonvolatile latch circuit further includes a write circuit which applies a first write voltage to the first control terminal, and applies a second write voltage that is greater than the first write voltage in absolute value to the second control terminal when the variable resistance element is caused to change from the first resistance state to the second resistance state, or is caused to change from the second resistance state to the first resistance state.

Accordingly, when the logic state of the latch circuit is written to the variable resistance element, the second transistor operates as a current steering element when causing a change to HR state which is the second resistance state, and the first transistor operates as a current steering element when causing a change to LR state which is the first resistance state. Even when the gate widths of the first transistor and the second transistor are equal, abnormally low resistance value beyond the drive capability of the second transistor can be prevented from being written to the variable resistance element by establishing a relationship that the first write voltage is less than the second write voltage. Therefore, a variable resistance element in LR state can be changed to HR state without fail. Consequently, even when the transistors with the gate width are used, the above-described problem 5 is solved, and thus it is possible to provide a nonvolatile latch circuit which stably maintains favorable resistance change operation with extremely high reliability of store operation.

In a preferred embodiment, the nonvolatile latch circuit further includes a write circuit which applies a third write voltage to the first control terminal and the second control terminal when the variable resistance element is caused to change from the second resistance state to the first resistance state, and applies a fourth write voltage that is greater than the third write voltage in absolute value to the first control terminal and the second control terminal when the variable resistance element is caused to change from the first resistance state to the second resistance state.

Accordingly, the latch circuit can be configured using a transistor with a minimum size.

In a preferred embodiment, the nonvolatile latch circuit further includes a write circuit which applies a fifth write voltage to the first control terminal and the second control terminal when the variable resistance element is caused to change from the first resistance state to the second resistance state or is caused to change from the second resistance state to the first resistance state, wherein a gate width of the first transistor is less than a gate width of the second transistor.

Accordingly, when the variable resistance element is caused to change from LR state to HR state, the second transistor operates as a load resistance, and when the variable resistance element is caused to change from HR state to LR state, the first transistor operates as a load resistance. Although the same fifth write voltage is inputted to the first control terminal and the second control terminal, the on-resistance of the first transistor is greater than the on-resistance of the second transistor because of the difference in the gate widths of the first and second transistors. Therefore, abnormally low resistance value beyond the drive capability of the second transistor can be prevented from being written to the variable resistance element. Therefore, a variable resistance element in LR state can be changed to HR state without fail by the second transistor. Consequently, the above-described problem 5 is solved by the control using just a single control line, and thus it is possible to provide a nonvolatile latch circuit which stably maintains favorable resistance change operation with extremely high reliability of store operation.

In a preferred embodiment, a capacitive load is connected between the first node and a ground terminal so that a value of a capacitive load connected to the first node is greater than or equal to a value of a capacitive load connected to the second node.

Or, a length of wiring connected to the second node is less than or equal to a length of wiring connected to the first node.

Accordingly, occurrence of noise can be suppressed, which may cause an overshoot of the waveform of the voltage across both ends of the variable resistance element in HR state reading step. Consequently, a malfunction causing a change from HR state to LR state can be prevented, and stable operation of restoring logic state can be achieved.

In a preferred embodiment, the oxide layer includes a stacked structure of a first oxide layer including a first transition metal and a second oxide layer including a second transition metal, a degree of oxygen deficiency of the first oxide layer is greater than a degree of oxygen deficiency of the second oxide layer, the second electrode is in contact with the second oxide layer, and the first electrode is in contact with the first oxide layer.

Accordingly, the variable resistance element changes to a high resistance state corresponding to the first resistance value by applying a voltage so as to cause a current to flow in the direction from the second electrode to the first electrode. Conversely, the variable resistance element can change to a low resistance state corresponding to a resistance value lower than the first resistance value by applying a voltage so as to cause a current to flow in the direction from the first electrode to the second electrode.

In a preferred embodiment, the first oxide layer is a tantalum oxide layer having a composition expressed by $TaO_x$ where $0.8 \leq x \leq 1.9$.

In a preferred embodiment, the second oxide layer is a second tantalum oxide layer having a composition expressed by $TaO_y$ where $2.1 \leq y$.

Accordingly, the variable resistance element which is added in order to provide a nonvolatile function is composed of a tantalum oxide. Ta is a proven material that is used in semiconductor process as a nitride TaN, an oxide $Ta_2O_5$, or the like. A tantalum oxide can be formed by processing in a room temperature or a relatively low temperature. That is to say, the process of forming the variable resistance element does not involve a heat process that requires a high processing temperature, and thus the performance of transistors is not impaired. In addition, a memory cell array region for recording logic states does not need to be formed separately from a logic circuit region. Consequently, after the transistors that constitute the logic circuit are formed on a semiconductor substrate, a variable resistance element can be formed on part of the wiring layer of plug contact, and thus the integration and fine forming in the logic circuit are not impaired.

In a preferred embodiment, a material of the second electrode is higher in standard electrode potential than a material of the first electrode.

Accordingly, even when a restore operation is performed to restore the state of the latch circuit after writing HR state to the variable resistance element, noise which causes the variable resistance element in HR state to change to LR state does not occur, and thus a nonvolatile latch circuit with high reliability in data storage can be provided.

A nonvolatile flip-flop circuit according to one aspect of the present invention is a nonvolatile flip-flop circuit including the above-described nonvolatile latch circuit, wherein the first and second logic inversion circuits are respectively first and second NAND gate circuits each including at least two input terminals, an output terminal of the first NAND gate circuit and one of the input terminals of the second NAND gate circuit are connected to each other via the third node, an output terminal of the second NAND gate circuit and one of the input terminals of the first NAND gate circuit are connected to each other via the fourth node, and the output terminal of the first NAND gate circuit and the second terminal of the first transistor are connected to each other via the third node, and the output terminal of the second NAND gate circuit and the fourth terminal of the second transistor are connected to each other via the fourth node.

A nonvolatile flip-flop circuit according to one aspect of the present invention is a nonvolatile flip-flop circuit including the above-described nonvolatile latch circuit, wherein the first and second logic inversion circuits are respectively first and second NOR gate circuits each including at least two input terminals, an output terminal of the first NOR gate circuit and one of the input terminals of the second NOR gate circuit are connected to each other via the third node, an output terminal of the second NOR gate circuit and one of the input terminals of the first NOR gate circuit are connected to each other via the fourth node, and the output terminal of the first NOR gate circuit and the second terminal of the first transistor are connected to each other via the third node, and the output terminal of the second NOR gate circuit and the fourth terminal of the second transistor are connected to each other via the fourth node.

According to these configurations, it is possible to provide a nonvolatile flip-flop circuit which is free from the above-described problems 1 to 5, and has data holding capability with a high speed and high reliability, and stores and restores the data latch state of the flip-flop circuit in an extremely stable manner.

Hereinafter, the embodiments of the present invention will be described with reference to the drawings. The numerical values such as a film thickness, a resistance, and a voltage shown in the following embodiments are each illustrated as a specific example, and actual values are not limited to these numerical values.

[Embodiment 1]
[Configuration of Variable Resistance Element]

First, a variable resistance element used for a nonvolatile latch circuit and a flip-flop circuit of the present invention is described.

FIG. 1 is an element configuration diagram illustrating an example of the schematic configuration of a variable resistance element having a nonvolatile latch circuit according to Embodiment 1 of the present invention. A variable resistance element 500 illustrated in FIG. 1 is formed on a semiconductor process structure including an ordinary CMOS transistor, and is connected to a semiconductor substrate using, for example, a plug layer 507 on the semiconductor substrate. An MOS transistor including a source-drain region 506 and a gate oxide layer 505 is formed on the substrate.

The variable resistance element 500 includes a first electrode layer 501 which is a first electrode formed on a metal wiring layer 508, a second electrode layer 504 which is a second electrode, and a first variable resistance layer 502 and a second variable resistance layer 503 that are interposed between the first electrode layer 501 and the second electrode layer 504. In the present embodiment, the first variable resistance layer 502 is a first oxygen-deficient oxide layer comprising a first transition metal, and is, for example, a first tantalum oxide layer having a low oxygen content atomic percentage. The definition of an oxygen-deficient oxide layer is described below. The second variable resistance layer 503 is a second oxide layer comprising a second transition metal, and is, for example, a second tantalum oxide layer which is formed on the above-mentioned first tantalum oxide layer, and has an oxygen content atomic percentage higher than that of the first tantalum oxide layer. By adopting such a configuration, oxidation reduction reaction within the second variable resistance layer 503 is promoted so as to stably cause a change of resistance.

Although the variable resistance element 500 is disposed on the plug layer 507 in FIG. 1, the configuration is not limited to this, and may be changed to an optimal arrangement and shape as needed in accordance with a semiconductor process, or the order of layer arrangement in the structure of the variable resistance element may be changed, or an adhesion layer may be interposed between layers in order to improve the adhesion therebetween.

The material to be used for the first electrode layer 501 and the second electrode layer 504 include, for example, Pt (platinum), Ir (iridium), Pd (palladium), W (tungsten), Cu (copper), Al (aluminum), TiN (titanium nitride), TaN (nitriding tantalum), TiAlN (titanium nitride aluminum), and the like.

The standard electrode potential of the material of the second electrode layer 504 which is in contact with the second variable resistance layer 503 is preferably higher than the standard electrode potential of the transition metal which constitutes the second variable resistance layer 503. The standard electrode potential of the material of the first electrode layer 501 which is in contact with the first variable resistance layer 502 is preferably lower than the standard electrode potential of the material of the second electrode layer 504, and is further preferably lower than the standard electrode potential of the transition metal which constitutes the first variable resistance layer 502.

This is because a material with a higher standard electrode potential is more resistant to oxidation, and thus oxygen ions can efficiently contribute to oxidation reduction reaction in a variable resistance layer which is in contact with an electrode with a higher standard electrode potential so that stable resistance change is obtained.

Among the above-mentioned electrode materials, the materials having a standard electrode potential higher than that of the transition metal which constitutes the variable resistance layers are Pt (platinum), Ir (iridium), and Pd (palladium) which are preferable as materials for the second electrode layer 504.

The first electrode layer 501 and the second electrode layer 504 are shaped in the same diameter in FIG. 1, however, the shape is not limited to this, and may be an optimal shape as needed in accordance with a semiconductor process.

Oxygen-deficient transition metal oxide (preferably oxygen tantalum oxide), for example, is used as the material for the first variable resistance layer 502 and the second variable resistance layer 503. The oxygen-deficient transition metal oxide is an oxide that has an oxygen content atomic percentage (atomic ratio: ratio of the number of oxygen atoms to the total number of atoms) smaller than that of an oxide having a stoichiometric composition. For example, in the case where the transition metal element is tantalum (Ta), the composition of stoichiometric oxide is $Ta_2O_5$, the ratio (O/Ta) of the number of atoms of Ta and O is 2.5. Therefore, in an oxygen-deficient Ta oxide, the atomic ratio of Ta and O is greater than 0 and less than 2.5. The type of transition metal element includes, for example, Fe (iron), Zn (zinc), Cr (chromium), nickel (nickel), Ti (titanium), W, Hf (hafnium), and the like, and the composition of stoichiometric oxide varies depending on the valence of each element.

The first transition metal that constitutes the first resistance change layer 502, and the second transition metal that constitutes the second resistance change layer 503 may be different from each other. For example, in the case where a first oxygen-deficient tantalum oxide layer ($TaO_x$) having a low oxygen content atomic percentage is used as the first variable resistance layer 502, a titanium oxide layer ($TiO_2$), for example, may be used as the second variable resistance layer 503. In this case, the resistance value of the second oxide layer which constitutes the second variable resistance layer 503 is preferably greater than the resistance value of the first oxide layer which constitutes the first variable resistance layer 502. In this case, the degree of oxygen deficiency of the second oxide layer which constitutes the second variable resistance layer 503 is preferably lower than the degree of oxygen deficiency of the first oxide layer which constitutes the first variable resistance layer 502. Here, the degree of oxygen deficiency refers to a degree (ratio) of deficient oxygen to the oxygen in a stoichiometric composition. For example, tantalum oxide having a stoichiometric composition is $Ta_2O_5$, and titanium oxide having a stoichiometric composition is $TiO_2$. Assuming that the degree of oxygen deficiency of each of these oxides is 0%, the degree of oxygen deficiency of metal Ta and Ti are 100%, the degree of oxygen deficiency of the oxide layer is defined accordingly. In general, a metal oxide having less degree of oxygen deficiency has a greater resistance.

In addition, the standard electrode potential of the transition metal which constitutes the second variable resistance layer 503 is preferably lower than the standard electrode potential of the transition metal which constitutes the first variable resistance layer 502. By adopting such a configuration, a voltage needed to cause a resistance change is efficiently applied to the second variable resistance layer 503, and oxidation reduction reaction within the second variable resistance layer 503 is promoted. Thus a change of resistance can be caused in a more stable manner.

In the present embodiment, the oxygen-deficient transition metal oxide is preferably an oxygen-deficient tantalum oxide (hereinafter referred to as Ta oxide). More preferably, the first variable resistance layer 502 is the first tantalum oxide layer having a composition expressed by TaO$_x$ where 0<x<2.5, the second variable resistance layer 503 is the second tantalum oxide layer having a composition expressed by TaO$_y$ where x<y, and these two layers forms a stacked structure. In addition to the above-mentioned layers, another layer, for example, a third tantalum oxide layer, another transition metal oxide layer, or the like which have an oxygen content atomic percentage different from that of the first tantalum oxide layer and the second tantalum oxide layer may be disposed as needed, or the above-mentioned two layers may be doped with a small amount of impurities. Here, TaO$_x$ as the first tantalum oxide layer preferably satisfies $0.8 \leq x \leq 1.9$, and TaO$_y$ as the second tantalum oxide layer preferably satisfies $2.1 \leq y$. The thickness of the first tantalum oxide layer is preferably 5 nm or more and 50 nm or less, while the thickness of the second tantalum oxide layer is preferably 1 nm or more and 8 nm or less. The thickness of the second tantalum oxide layer is preferably less than that of the first tantalum oxide layer.

In the variable resistance element 500 configured as described above, the variable resistance element changes to a high resistance state (referred to as HR state or HR) corresponding to the second resistance state by applying a second predetermined voltage so as to cause a current to flow in the direction from the second electrode layer 504 in contact with the second variable resistance layer 503 to the first electrode layer 501 in contact with the first variable resistance layer 502. Conversely, the variable resistance element changes to a low resistance state (referred to as LR state or LR) corresponding to the first resistance state having a resistance value lower than the above-mentioned second resistance state by applying a first predetermined voltage so as to cause a current to flow in the direction from the first electrode 501 to the second electrode layer 504.

[Current-Voltage Characteristics of Variable Resistance Element]

Next, the current-voltage characteristics of the variable resistance element according to the present embodiment are described.

Figure 2A:
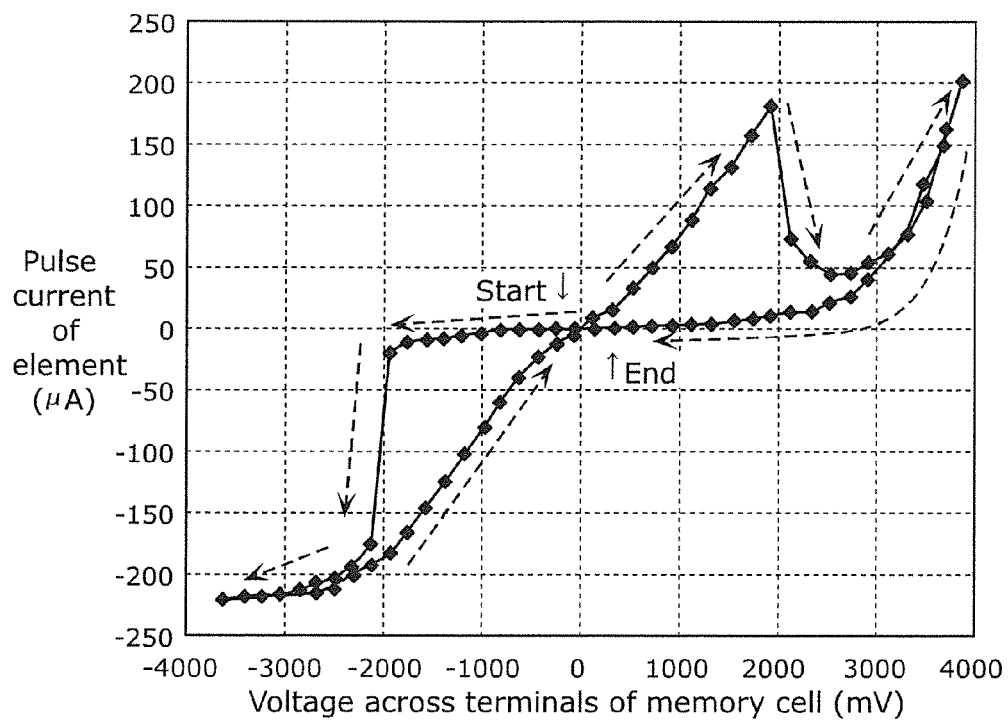
FIG. 2A is a graph illustrating an example of current-voltage characteristics of the variable resistance element according to Embodiment 1 of the present invention.
Figure 2B:
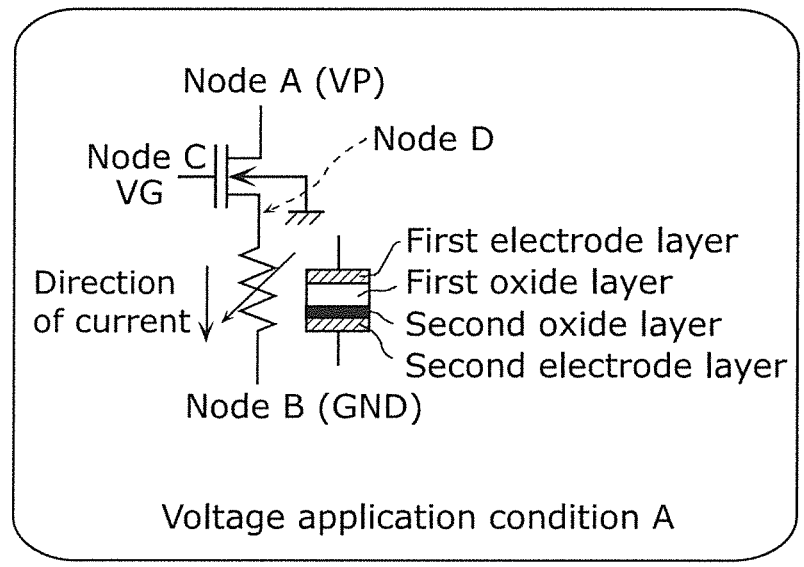
FIG. 2B is a diagram illustrating a voltage application state of negative voltage characteristics in the current-voltage characteristics of the variable resistance element shown in FIG. 2A.
Figure 2C:
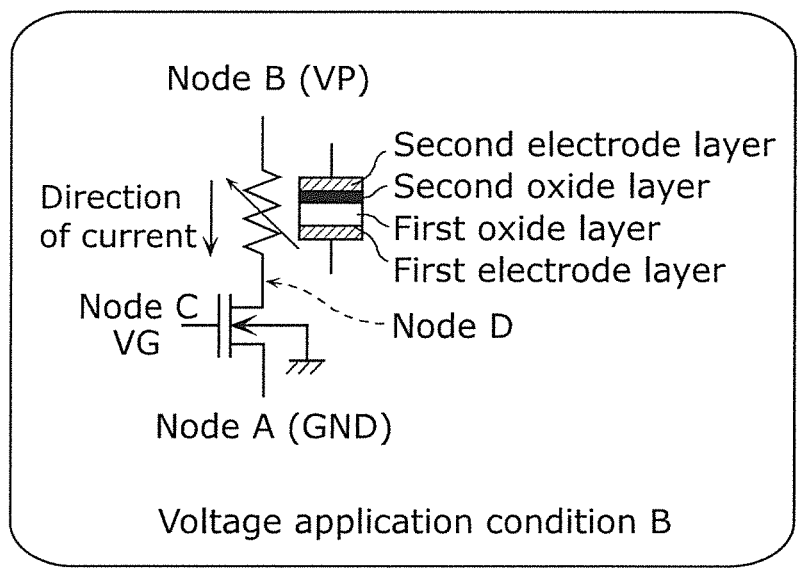
FIG. 2C is a diagram illustrating a voltage application state of positive voltage characteristics in the current-voltage characteristics of the variable resistance element shown in FIG. 2A.

FIG. 2A is a graph illustrating an example of current-voltage characteristics of the variable resistance element according to Embodiment 1 of the present invention. FIG. 2B is a diagram illustrating a voltage application state of negative voltage characteristics in the current-voltage characteristics of the variable resistance element shown in FIG. 2A. FIG. 2C is a diagram illustrating a voltage application state of positive voltage characteristics in the current-voltage characteristics of the variable resistance element shown in FIG. 2A. In the voltage application state A illustrated in FIG. 2B and the voltage application state B illustrated in FIG. 2C, the first electrode layer 501 of the variable resistance element 500 and an N-type MOS transistor are connected in series via node D as illustrated in FIG. 1. As illustrated in FIGS. 2B and 2C, the substrate of the N-type MOS transistor is grounded to the ground level (GND).

In the voltage application state A, i.e., in a state where node B is grounded to GND and a voltage of 4V is applied to the gate terminal of the transistor at node C, a pulse voltage (VP) applied to node A is incremented and decremented by a step amount. The amounts of the pulse voltage and the pulse current in the above steps are each plotted as a negative polarity in FIG. 2A. On the other hand, in the voltage application state B, i.e., in a state where node A is grounded to GND by changing connection-relationship in the voltage application state A with a semiconductor switch or the like, and a voltage of 4V is applied to the gate terminal of the transistor at node C, a pulse voltage (VP) applied to node B is incremented and decremented by a step amount. The amounts of the pulse voltage and the pulse current in the above steps are each plotted as a positive polarity in FIG. 2A As illustrated in FIG. 2A, the variable resistance element used in the present invention shows hysteresis characteristics in the current-voltage characteristics. When a positive voltage application is defined as the voltage application which causes a current to flow from the second electrode layer 504 to the first electrode layer 501, and a negative voltage application is defined as the voltage application which causes a current to flow from the first electrode layer 501 to the second electrode layer 504, it can be seen that the positive voltage application causes a resistance change to high resistance state, and the negative voltage application causes a resistance change to low resistance state. Whether the application of polarity of a positive voltage or a negative voltage causes a resistance change to high or low resistance state depends on a variation of the definition, and is not essential in the present invention. That is to say, the variable resistance element used in the present embodiment applies a predetermined voltage level or higher as illustrated in FIG. 2A, and whether the resistance value is increased or decreased is determined by the direction of the current that flows through the variable resistance layer.

[Configuration of Nonvolatile Latch Circuit]

Next, the nonvolatile latch circuit according to Embodiment 1 of the present invention will be described with reference to FIG. 3.

Figure 3:
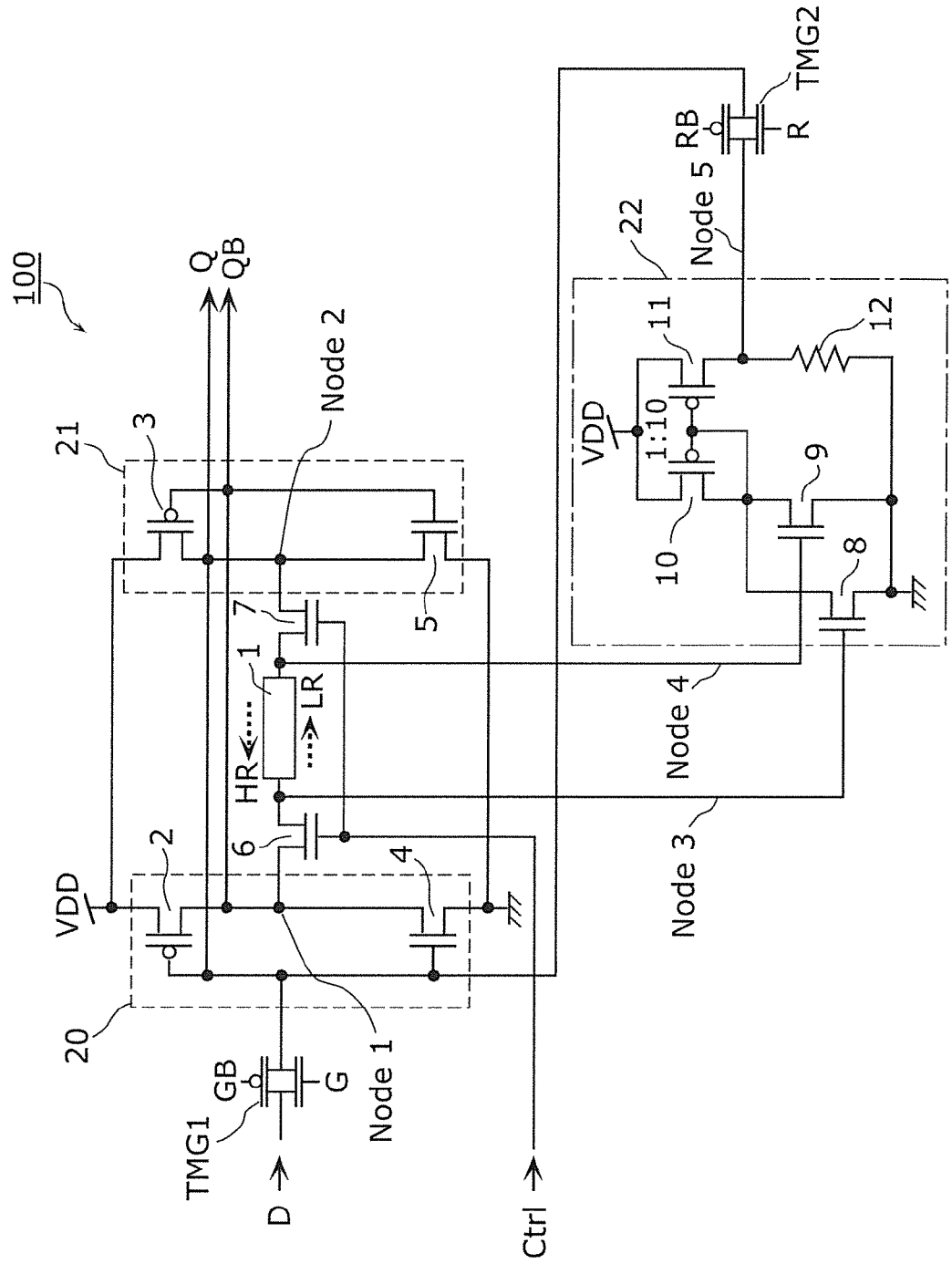
FIG. 3 is a circuit configuration diagram of the nonvolatile latch circuit according to Embodiment 1 of the present invention.

FIG. 3 is a circuit configuration diagram of the nonvolatile latch circuit according to Embodiment 1 of the present invention. A nonvolatile latch circuit 100 illustrated in FIG. 3 includes a variable resistance element 1, transistors 6 and 7, inverter circuits 20 and 21, a summing amplifier circuit 22, and transmission gates TMG1 and TMG2. The inverter circuit 20 includes transistors 2 and 4, and the inverter circuit 21 includes transistors 3 and 5. The summing amplifier circuit 22 includes transistors 8, 9, 10, 11, and a resistance element 12.

The variable resistance element 1 has, for example, the same structure as that of the variable resistance element 500 illustrated in FIG. 1, and has the same characteristics as the current-voltage characteristics illustrated in FIG. 2A.

The transistors 2, 3, 10, and 11 are P-type MOSFETS, for example, and the transistors 4 to 9 are N-type MOSFETS, for example.

The inverter circuits 20 and 21 are the first logic inversion circuit and the second logic inversion circuit, respectively, and constitute a latch operating unit, where the output terminal of one inverter circuit is cross coupled to the input terminal of the other inverter circuit. The output terminal of the inverter circuit 20 is connected via node 1 to either one of the source terminal and the drain terminal of the transistor 6; the other of the source terminal and the drain terminal of the transistor 6 is connected via node 3 to the first electrode of the variable resistance element 1; the second electrode of the variable resistance element 1 is connected via node 4 to the other of the source terminal and the drain terminal of the transistor 7; and the one of the source terminal and the drain terminal of the transistor 7 is connected via node 2 to the output terminal of the inverter circuit 21. That is to say, the transistor 6, the variable resistance element 1, and the transistor 7 are connected in series in this order, and constitute a state storage unit, and the output terminal of the inverter circuit 20 and the output terminal of the inverter circuit 21 are connected via the series connection.

The first transistor described in the appended claims corresponds to the transistor 6, and the second transistor described in the appended claims corresponds to the transistor 7. The first terminal of the first transistor described in the appended claims corresponds to either one of the source terminal and the drain terminal of the transistor 6, and the second terminal corresponds to the other of the source terminal and the drain terminal of the transistor 6. The first terminal of the second transistor described in the appended claims corresponds to either one of the source terminal and the drain terminal of the transistor 7, and the second terminal corresponds to the other of the source terminal and the drain terminal of the transistor 7. In addition, the third node, the fourth node, the first node, and the second node described in the appended claims correspond the above-mentioned node 1, node 2, node 3, and node 4, respectively.

The circuit connection is made such that the variable resistance element 1 changes to HR state (second resistance state) by applying a voltage higher than the second predetermined voltage so as to cause a current to flow in the direction from node 4 to node 3, and the variable resistance element 1 changes to LR state (first resistance state) by applying a voltage higher than the first predetermined voltage so as to cause a current to flow in the direction from node 3 to node 4. A gate voltage applied to the gate terminals which are control terminals of the transistors 6 and 7 can be controlled from Ctrl terminal.

The node 3 and node 4 which are located at both ends of the variable resistance element 1 are connected to the gate terminals of the transistors 8 and 9, respectively; the source terminals of the transistors 8 and 9 are grounded to GND; and the drain terminals of the transistors 8 and 9 are connected to each other. The transistors 10 and 11 form a current mirror circuit, and the mirror ratio is 1:10, for example. That is to say, the current as a composite of the currents flowing through the transistors 8 and 9 is amplified by 10 times and flows through the resistance element 12. The resistance element 12 is illustrated as a fixed resistance for the sake of easy understanding, however, a nonlinear resistance element such as on-resistance of a transistor may be used. In the summing amplifier circuit 22, when a read voltage smaller than the first voltage and the second voltage in absolute value is applied to the gate terminals of the transistors 6 and 7, respective drain currents according to the gate potentials of node 3 and node 4 are added, and amplified by the current mirror, and then flows through the resistance element 12. The voltage generated accordingly across the terminals of the resistance element 12 is outputted to the input terminal of the inverter circuit 20, and the output terminal of the inverter circuit 21 via transmission gate TMG2.

Figure 4:
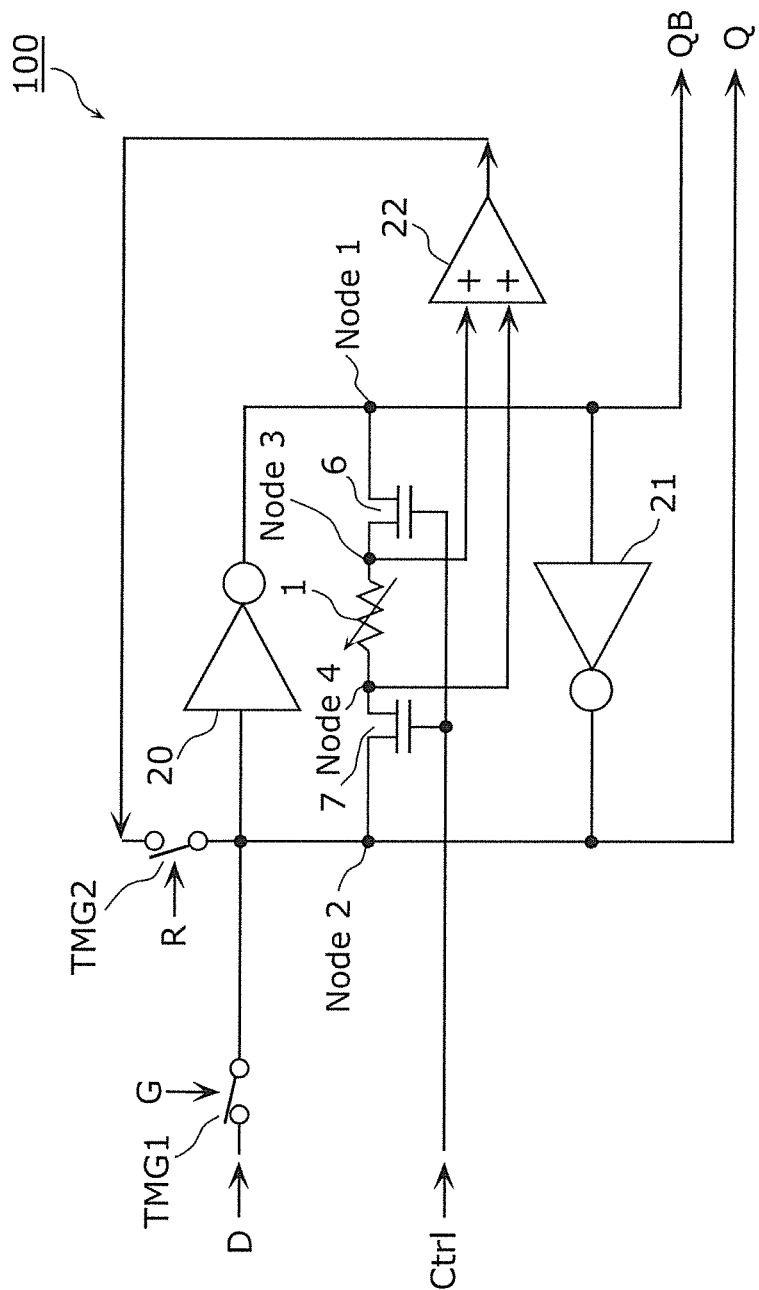
FIG. 4 is a block configuration diagram of the nonvolatile latch circuit according to Embodiment 1 of the present invention.

FIG. 4 is a block configuration diagram of the nonvolatile latch circuit according to Embodiment 1 of the present invention. This configuration diagram is expressed as a simplified block diagram of the circuit diagram of the nonvolatile latch circuit 100 illustrated in FIG. 3, and the components labeled with the same symbols are the same in both diagrams.

Next, the operation of nonvolatile latch circuit 100 according to the present embodiment is described sequentially.
[Latch Operation]
First, by a latch operation of the nonvolatile latch circuit 100, Ctrl terminal and R terminal of the transmission gate TMG2 are grounded to GND (while RB terminal is set to VDD) in FIG. 3 and FIG. 4. Accordingly, the transistors 6 and 7, and the transmission gate TMG2 become off, and thus the variable resistance element 1 and the summing amplifier circuit 22 are separated from the latch operating unit which is comprised of the inverter circuits 20 and 21 so that the latch operating unit operates as an ordinary cross-coupled latch circuit.

That is to say, because attached circuits needed for the variable resistance elements and nonvolatile operations have absolutely no influence on a latch operation, the latch operation can be performed at nearly the operation speed of MOSFET which is a component of the latch operation section without reducing the operation speed of the latch operation. In addition, a current constantly flowing through the variable resistance elements is eliminated, and thus the characteristics of low power consumption of the latch operating unit including CMOS circuits are not impaired. Furthermore, a stress is not applied to each variable resistance element by the latch operation, and thus there is no degradation factor for the variable resistance element either. The above latch operating unit can also operate as a clock-synchronized D-latch circuit by inputting a clock signal (CLK) for synchronization to G terminal of the transmission gate TMG1, and inputting an inversion signal of the CLK to GB terminal.
[Store Operation]
Next, the store operation of the latch state which is the greatest characteristic of the present invention, i.e., the write operation of information to a variable resistance element will be described with reference to FIGS. 5A to 7. In FIGS. 5A to 6B, the components labeled with the same symbols as those in FIGS. 3 and 4 indicate the same components.

Figure 5A:
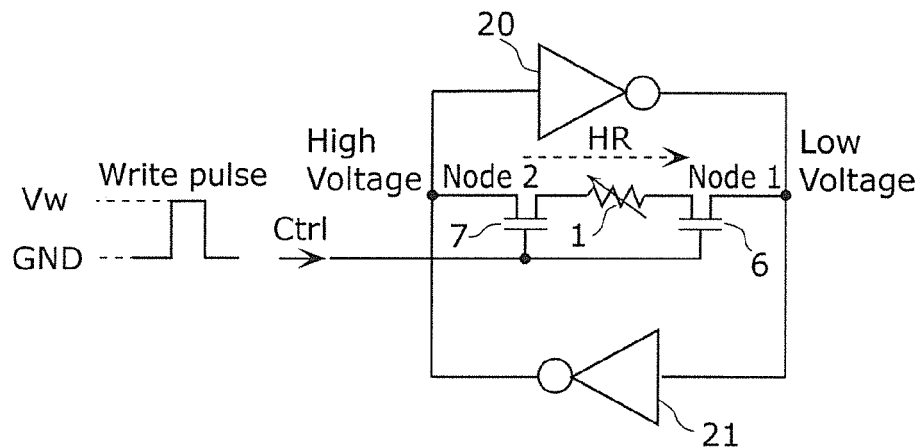
FIG. 5A is a diagram illustrating writing of HR state in a state storage operation of the nonvolatile latch circuit according to Embodiment 1 of the present invention.
Figure 5B:
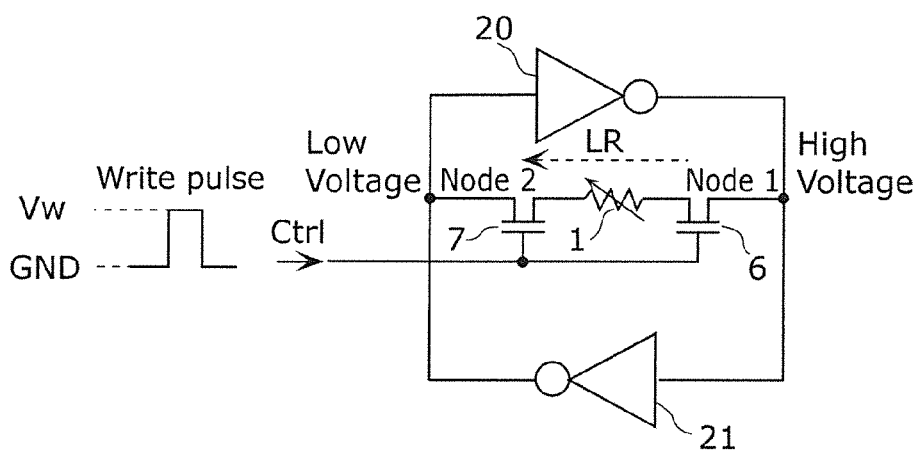
FIG. 5B is a diagram illustrating writing of LR state in a state storage operation of the nonvolatile latch circuit according to Embodiment 1 of the present invention.

FIG. 5A is a diagram illustrating writing of HR state in a state storage operation of the nonvolatile latch circuit according to Embodiment 1 of the present invention. FIG. 5B is a diagram illustrating writing of LR state. Specifically, FIG. 5A illustrates a state where node 1 is latched to a Low voltage and node 2 is latched to a High voltage in the nonvolatile latch circuit according to Embodiment 1. FIG. 5B illustrates a state where node 1 is latched to a High voltage and node 2 is latched to a Low voltage. When a write pulse with a voltage amplitude of Vw is applied to the gate terminals of the transistors 6 and 7 from Ctrl terminal in the states illustrated in FIGS. 5A and 5B where the absolute value of the voltage amplitude is larger than that of the first voltage or the second voltage (|Vw|>|first voltage| or |second voltage|), a pulse with a voltage amplitude is applied to the variable resistance element 1 where the voltage amplitude has reduced from Vw by a threshold voltage Vt of the transistors. Consequently, it is more preferable that |Vw| is determined so as to be higher than the voltage amplitude obtained by adding the voltage Vt to the above mentioned |first voltage| or |second voltage|. The above-mentioned write voltage is generated, for example, by a write circuit included in the nonvolatile latch circuit 100, and is outputted to the above-mentioned Ctrl terminal from the write circuit. In the state of node 1 and node 2 illustrated in FIG. 5A, a second current flows in the direction from node 2 to node 1, and the variable resistance element 1 changes to HR state. On the other hand, in the state of node 1 and node 2 illustrated in FIG. 5B, a first current flows in the direction from node 1 to node 2, and the variable resistance element 1 changes to LR state.

In the above step, the absolute value of the above-mentioned first current is set to be less than the absolute value of the above-mentioned second current. For example, when writing is performed on the variable resistance element 1 using the transistors 6 and 7 of the same size, the write pulse with the voltage amplitude of Vw, which is applied to the gate terminals of the transistors 6 and 7 may be set as follows. Under the assumption that the absolute value of the voltage amplitude is Vw1 (the third write voltage described in the appended claims) when the variable resistance element 1 changes from HR state to LR state, and the absolute value of the voltage amplitude is Vw2 (the fourth write voltage described in the appended claims) when the variable resistance element 1 changes from LR state to HR state, the relationship of Vw1<Vw2 may be satisfied. By adopting such a configuration, the latch circuit can be formed using the minimum-sized transistors.

In the case where writing is performed to the variable resistance element 1 using the write pulse (the fifth write voltage described in the appended claims) with the same voltage amplitude Vw, the transistors 6 and 7 may be designed so that the relationship of Wa<Wb is satisfied where Wa is the gate width of the transistor 6 and Wb is the gate width of the transistor 7. It should be noted that the gate lengths of the transistors 6 and 7 are the same in the above. By adopting such a configuration, the write circuit in a simple configuration can be used. This will be described in detail with reference to FIGS. 6A, 6B, and 7.

Figure 6A:
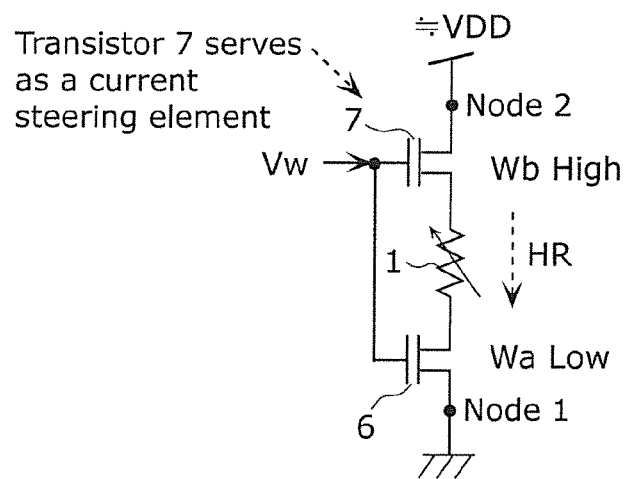
FIG. 6A is a circuit diagram illustrating a write operation to the variable resistance element in voltage application state B in FIG. 2C.
Figure 6B:
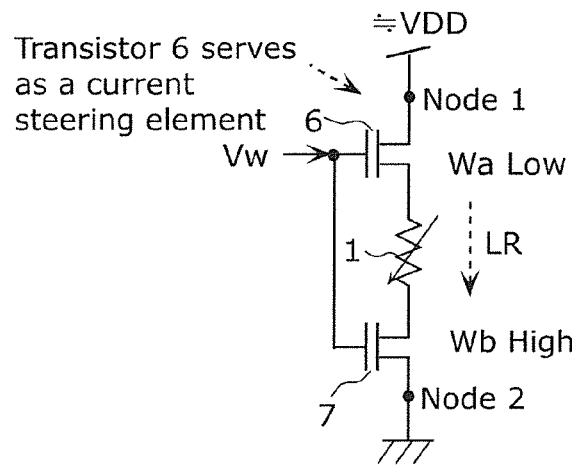
FIG. 6B is a circuit diagram illustrating a write operation to the variable resistance element in voltage application state A in FIG. 2B.
Figure 7:
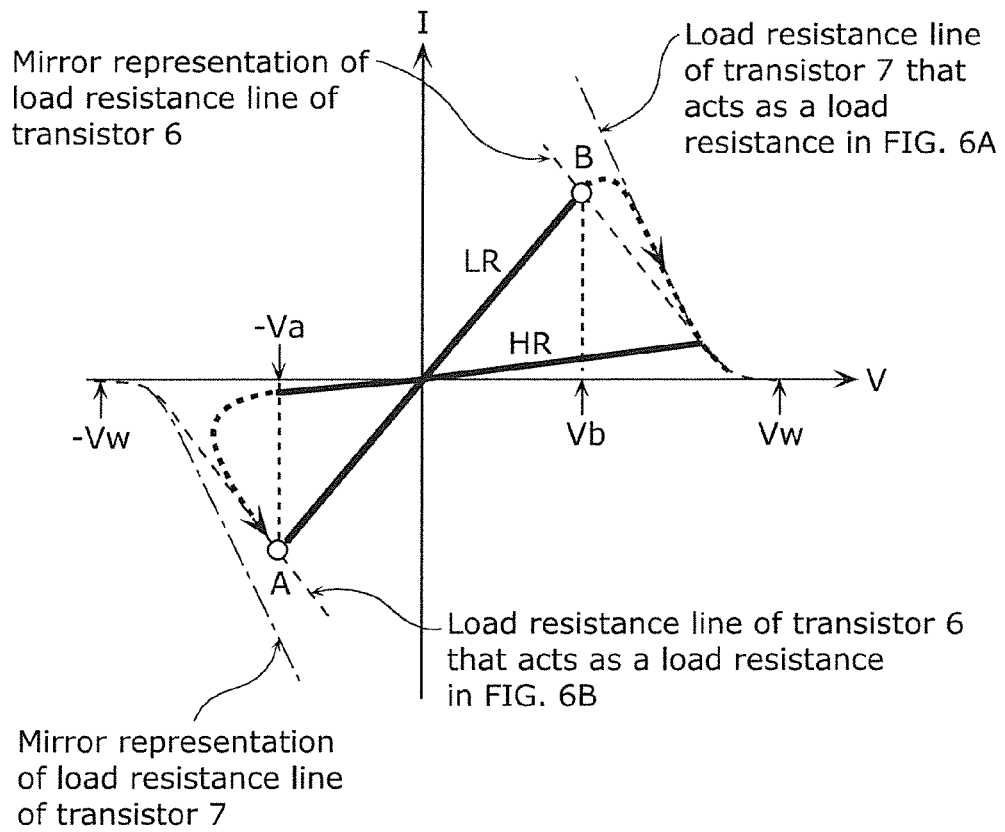
FIG. 7 is a graph in which a load resistance line of each transistor through which current flow is limited is superimposed on the current-voltage characteristics of the variable resistance element.

FIG. 6A is a circuit diagram illustrating a write operation to the variable resistance element in voltage application state B in FIG. 2C, and FIG. 6B is a circuit diagram illustrating a write operation to the variable resistance element in voltage application state A in FIG. 2B. FIG. 7 is a graph in which a load resistance line of each transistor through which current flow is limited is superimposed on the current-voltage characteristics of the variable resistance element.

In FIG. 6A, a value nearly the power source voltage VDD, which corresponds to a High voltage is applied to the drain (node 2) of the transistor 7. On the other hand, a value nearly the ground level (GND), which corresponds to a Low voltage is applied to the source (node 1) of the transistor 6. That is to say, the transistor 7 operates as a source follower circuit of the variable resistance element 1, and therefore, even when the gate width Wb of the transistor 7 is almost the same as or slightly wider than the gate width Wa of the transistor 6, the current drive capability of the transistor 7 becomes lower than that of the transistor 6 which operates with the source being grounded, because of the back bias effect of the transistors. That is to say, in HR state change of the variable resistance element 1 illustrated in FIG. 6A, the current which flows through the element is determined by the drive capability of the transistor 7. On the contrary, in FIG. 6B, a value nearly the power source voltage VDD, which corresponds to a High voltage is applied to the drain (node 1) of the transistor 6. On the other hand, a value nearly the ground level (GND), which corresponds to a Low voltage is applied to the source (node 2) of the transistor 7. That is to say, the transistor 6 operates as a source follower circuit of the variable resistance element 1, and therefore, the current drive capability of the transistor 6 becomes lower than that of the transistor 7 which operates with the source being grounded. That is to say, in LR state change of the variable resistance element 1 illustrated in FIG. 6B, the current which flows through the variable resistance element 1 is determined by the drive capability of the transistor 6.

As described above, when the variable resistance element 1 is caused to change from LR state to HR state, the voltage level that can be applied to the variable resistance element 1 in LR state is limited by the drive capability of the transistor 7. Conversely, the variable resistance element 1 is caused to change from HR state to LR state, the voltage level that can be applied to the variable resistance element 1 in LR state after the change is limited by the drive capability of the transistor 6.

The current-voltage characteristics in FIG. 7 is illustrated by assuming that the voltage application state in FIG. 6A is positive polarity, and the voltage application state in FIG. 6B is negative polarity. In FIG. 7, when the first predetermined voltage (|Va|) or higher is applied to both ends of the variable resistance element 1 in HR state, the variable resistance element 1 starts to change to LR. The resistance value in LR state in the above step is determined by a load resistance, and change to a low resistance state is stopped at an operating point A which is the intersection point between the load resistance line of the transistor 6 and V=Va so that the resistance value is determined. On the other hand, a change from LR state to HR state starts when the voltage across both ends of the resistance change element 1 exceeds the second predetermined voltage Vb of an operating point B.

In the case of the variable resistance element 1 comprising an oxygen-deficient tantalum oxide which is used in Embodiment 1 of the present invention, the above-mentioned |Va| and |Vb| have an almost equal relationship as the characteristics in FIG. 2A. As described above, when the variable resistance element 1 is caused to change from LR state to HR state, the voltage to be applied to the variable resistance element 1 is determined by the drive capability of the transistor 7, however, a voltage of Vb or higher may be applied to the variable resistance element 1 in LR state by disposing the transistor 7 with a gate width wider than that of the transistor 6. This may be understood by the fact that the slope of the load resistance line of the transistor 7 is greater than that of the mirror representation of the load resistance line of the transistor 6, that is point symmetric to the load resistance line of the transistor 6 around the origin as illustrated in FIG. 7.

As described above, according to the configuration of Embodiment 1 of the present invention, when the logic state of the latch operating unit is written to the variable resistance element 1, the transistor 7 operates as a current steering element for a change to HR state, and the transistor 6 operates as a current steering element for a change to LR state. Thus, abnormally low resistance value beyond the drive capability of the transistor 7 can be prevented from being written to the variable resistance element 1 by previously setting the relationship of Wa<Wb between the gate width (Wa) of the transistor 6 and the gate width (Wb) of the transistor 7. In other words, when the variable resistance element 1 is caused to change from HR state to LR state, or from LR state to HR state, a change to an abnormal LR state in which a change to HR state may not be made can be prevented by increasing the load resistance used for a change to LR state higher than the load resistance used for a change to HR state. Consequently, it is possible to provide a nonvolatile latch circuit which stably maintains favorable resistance change operation with extremely high reliability of store operation.

[Restore Operation]

Next, the restore operation is described, which restores the previous logic state of the latch operating unit from the resistance state stored in the variable resistance element 1.

Figure 8:
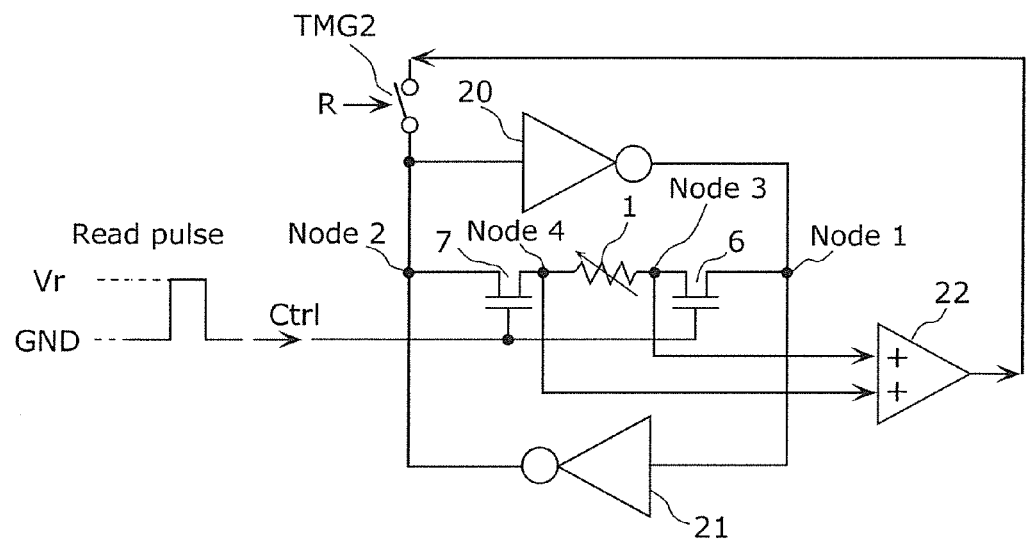
FIG. 8 is a block configuration diagram of a read (restore) operation for restoring a logic state of a latch circuit based on a resistance value stored in the variable resistance element in the nonvolatile latch circuit according to Embodiment 1 of the present invention.

FIG. 8 is a block configuration diagram of a read (restore) operation for restoring a logic state of a latch circuit based on a resistance value stored in the variable resistance element in the nonvolatile latch circuit according to Embodiment 1 of the present invention. Only the part relating to the restore operation in the block configuration illustrated in FIG. 4 is extracted and illustrated in FIG. 8. In the restore operation illustrated in FIG. 8, the transmission gate TMG1 is set to off, and the transmission gate TMG2 is set to on state.

Normally, when the power source of a latch circuit is turned on, the initial state of the latch circuit is not constantly the same because arrangements of circuit and the relationship of connection to other logic circuits are varied, and loads and capacities are different. That is to say, in the configuration illustrated in FIG. 8, there are two logic states: the case where node 2 is at a High level and node 1 is at a Low level, and the case where node 1 is at a High level and node 2 is at a Low level. For a restore operation, it is desirable that the state of the latch circuit in the previous storing step is restored from the resistance state of the variable resistance element 1 regardless of the logic state of the latch circuit. In order to facilitate the understanding of the restore operation according to the present embodiment, FIGS. 9A to 9D illustrate circuit states for separate cases where node 1 is at a High level, and where node 2 is at a High level.

Figure 9A:
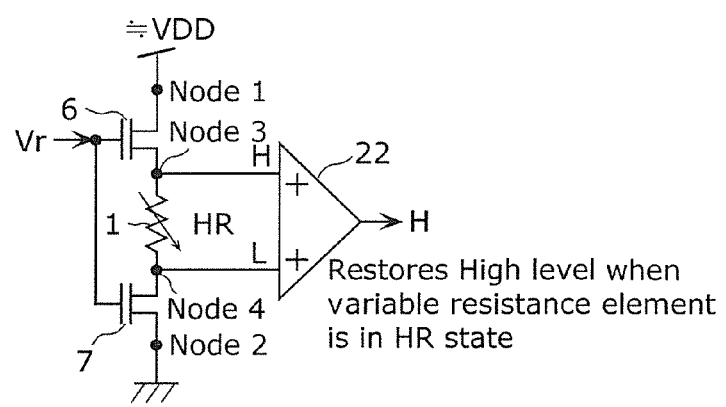
FIG. 9A is a diagram illustrating a read operation when the variable resistance element is in HR state, node 1 is at a High level, and node 2 is at a Low level in the nonvolatile latch circuit according to Embodiment 1 of the present invention.
Figure 9B:
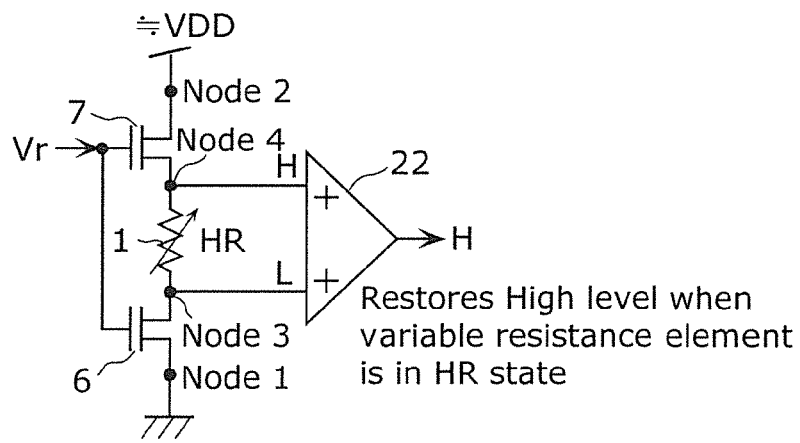
FIG. 9B is a diagram illustrating a read operation when the variable resistance element is in HR state, node 1 is at a Low level, and node 2 is at a High level in the nonvolatile latch circuit according to Embodiment 1 of the present invention.
Figure 9C:
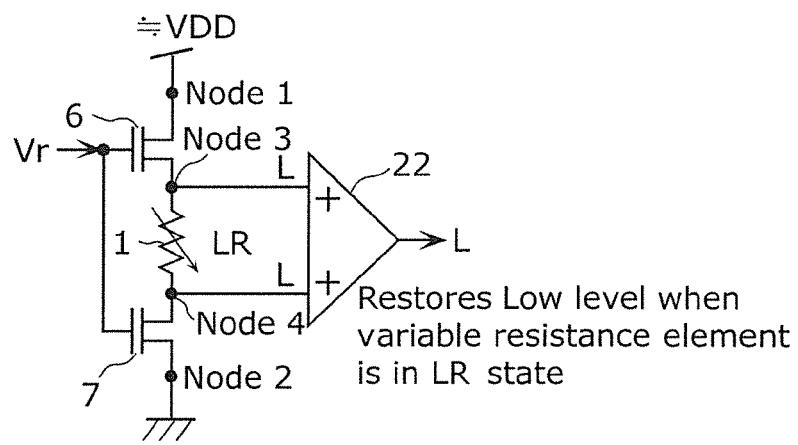
FIG. 9C is a diagram illustrating a read operation when the variable resistance element is in LR state, node 1 is at a High level, and node 2 is at a Low level in the nonvolatile latch circuit according to Embodiment 1 of the present invention.
Figure 9D:
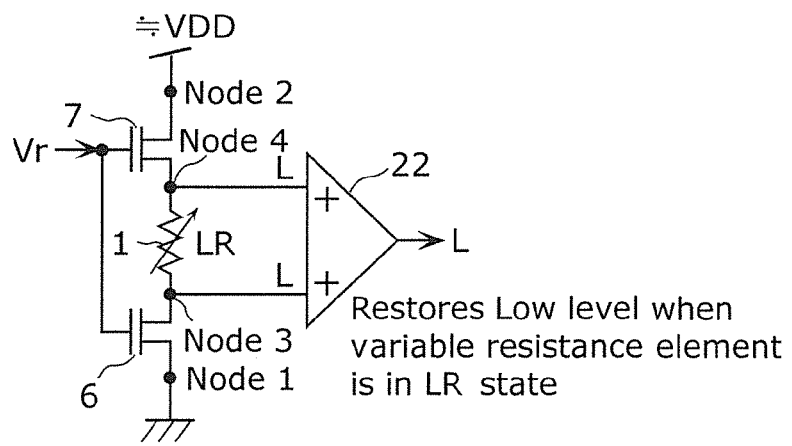
FIG. 9D is a diagram illustrating a read operation when the variable resistance element is in LR state, node 1 is at a Low level, and node 2 is at a High level in the nonvolatile latch circuit according to Embodiment 1 of the present invention.

FIG. 9A is a diagram illustrating a read operation when the variable resistance element is in HR state, node 1 is at a High level, and node 2 is at a Low level in the nonvolatile latch circuit according to Embodiment 1 of the present invention. FIG. 9B is a diagram illustrating a read operation when the variable resistance element is in HR state, node 1 is at a Low level, and node 2 is at a High level. FIG. 9C is a diagram illustrating a read operation when the variable resistance element is in LR state, node 1 is at a High level, and node 2 is at a Low level. FIG. 9D is a diagram illustrating a read operation when the variable resistance element is in LR state, node 1 is at a Low level, and node 2 is at a High level.

First, as illustrated in FIG. 8, at the time of restoring operation, a read pulse with voltage amplitude Vr is inputted from Ctrl terminal, where the absolute value of Vr is smaller than that of the first voltage and the second voltage. For example, specific values in a simulated example demonstrates that when the variable resistance element 1 is such that LR=5 kΩ and HR=100 kΩ, Vr is 1.5V. FIG. 9A indicates the state where node 1 is nearly at the power source voltage VDD corresponding to a High voltage, and node 2 is grounded to the ground (GND) corresponding to a Low voltage. Then, a read pulse with Vr of 1.5 V is applied to the gate terminals of the transistors 6 and 7. Because the variable resistance element 1 is 100 kΩ, which is a high resistance state (HR), node 3 is at a potential which is reduced by the threshold voltage (Vth) of the transistor, and specifically, the potential is 0.67 V. On the other hand, node 4 is at almost ground level, 0V because the transistor 7 operates in a complete on-region.

The potential of node 3 is inputted to the transistor 8 included in the summing amplifier circuit 22, and the potential of node 4 is inputted to the transistor 9 included in the summing amplifier circuit 22. Because the potential of node 3 is 0.67 V, the transistor 8 is set in ON state. Because the potential of node 4 is 0 V, the transistor 9 is set in OFF state. The current which the transistor 8 causes to flow is amplified by the current mirror circuit of the summing amplifier circuit 22 including the transistors 10 and 11. The amplified current flows through, for example, the resistance element 12 which is set to 20 kΩ, and sets the output terminal of the summing amplifier circuit 22 to a High level. Because the output terminal of the summing amplifier circuit 22 is fed back to node 2, node 2 is set to High and node 1 is set to Low so that the previous logic state of the latch circuit is restored.

Similarly, FIG. 9B indicates the state where node 2 is nearly at the power source voltage VDD corresponding to a High voltage, and node 1 is grounded to the ground (GND) corresponding to a Low voltage. Then, similarly to the state in FIG. 9A, a read pulse with Vr of 1.5 V is applied to the gate terminals of the transistors 6 and 7. Because the variable resistance element 1 is 100 kΩ, which is a high resistance state (HR), node 4 is at 0.67 V which has been reduced by the threshold voltage (Vth) of the transistor. On the other hand, node 4 is at almost ground level, 0V because the transistor 6 operates in an entire on-region.

Because the potential of node 4 is 0.67 V, the transistor 9 is set in ON state. Because the potential of node 3 is 0 V, the transistor 9 is set in ON state. The current which the transistor 9 causes to flow is amplified by the current mirror circuit of the summing amplifier circuit 22 including the transistors 10 and 11, and the output terminal of the summing amplifier circuit 22 is set to a High level in the same manner as in FIG. 9A. Because the output terminal of the summing amplifier circuit 22 is fed back to node 2, node 2 is set to High and node 1 is set to Low so that the previous logic state of the latch circuit is restored. That is to say, when the variable resistance element 1 is in HR state, node 2 is set to High and node 1 is set to Low so that the previous logic state of the latch circuit is restored regardless of the current logic state of the latch circuit.

Next, FIG. 9C indicates the state where node 1 is nearly at the power source voltage VDD corresponding to a High voltage, and node 2 is grounded to the ground (GND) corresponding to a Low voltage. Then, a read pulse (Vr) of 1.5 V is applied to the gate terminals of the transistors 6 and 7. Because the variable resistance element 1 is 5 kΩ, which is a low resistance state (LR), the potential at node 3 is reduced by the voltage value obtained by adding a voltage drop caused by the on-resistance of the transistor 6 to the threshold voltage (Vth) of the transistors, and specifically, is reduced to 0.18 V. On the other hand, the potential of node 4 is reduced by a slight voltage drop to be 0.16 V because the on-resistance is not negligible even though the transistor 7 operates in an entire on-region.

Although the potential of node 3 is inputted to the transistor 8 and the potential of node 4 is inputted to the transistor 9, the potentials are less than respective triggering voltages to turn on the transistors 8 and 9, and thus both transistors 8 and 9 are set in OFF state. Consequently, the current which flows through the resistance element 12 is reduced, and the output terminal of the summing amplifier circuit 22 is set at a Low level. Because the output terminal of the summing amplifier circuit 22 is fed back to node 2, node 2 is set to Low and node 1 is set to High so that the previous logic state of the latch circuit is restored.

Similarly, FIG. 9D indicates the state where node 2 is nearly at the power source voltage VDD corresponding to a High voltage, and node 1 is grounded to the ground (GND) corresponding to a Low voltage. Then, a read pulse (Vr) of 1.5 V is applied to the gate terminals of the transistors 6 and 7 similarly to the state in FIG. 9A. Because the variable resistance element 1 is 5 kΩ, which is a low resistance state (LR), the potential at node 4 is reduced by the voltage value obtained by adding a voltage drop caused by the on-resistance of the transistor 7 to the threshold voltage (Vth) of the transistors, and specifically, is reduced to 0.18 V. On the other hand, the potential of node 3 is reduced by a slight voltage drop to be 0.16 V because the on-resistance is not negligible even though the transistor 6 operates in an entire on-region. Although the potential of node 3 is inputted to the transistor 8 and the potential of node 4 is inputted to the transistor 9, the potentials are less than respective triggering voltages to turn on the transistors 8 and 9, and thus both transistors 8 and 9 are set in OFF state. Consequently, the current which flows through the resistance element 12 is reduced, and the output terminal of the summing amplifier circuit 22 is set at a Low level in the same manner as in FIG. 9C. Because the output terminal of the summing amplifier circuit 22 is fed back to node 2, node 2 is set to Low and node 1 is set to High so that the previous logic state of the latch circuit is restored. That is to say, when the variable resistance element 1 is in LR state, node 2 is set to Low and node 1 is set to High so that the previous logic state of the latch circuit is restored regardless of the current logic state of the latch circuit.

That is to say, as illustrated in FIGS. 9A to 9D, there are two types of state of the variable resistance element, i.e., HR and LR, and two types of level of node 1 of the latch circuit, i.e., High level and Low levels, and thus total of four types of combinations exist. When a read voltage (Vr) smaller in absolute value than the voltage which is applied to the gate terminals of the transistors 6 and 7 in rewriting of the resistance state is applied to the gate terminals of the transistors 6 and 7, the summing amplifier circuit 22 outputs a High level or a Low level corresponding to the logic state of the latch operating unit, in accordance with the value obtained by adding the potential of node 3 (the first node) to the potential of node 4 (the second node). Regardless of any combination in the above-mentioned four types of combinations, when the variable resistance element is in HR state, node 1 (the third node) is restored to a Low level, and node 2 (the fourth node) is restored to a High level. On the other hand, when the variable resistance element is in LR state, node 1 (the third node) is restored to a High level, and node 2 (the fourth node) is restored to a Low level. Accordingly, the summing amplifier circuit 22 stably restores the logic state of the latch operating unit including the inverter circuits 20 and 21 from the resistance state stored in the variable resistance element 1.

As described above, the restore operation of the nonvolatile latch circuit according to Embodiment 1 of the present invention is not a restore operation like the conventional art, which uses the power source start-up of the latch circuit. Consequently, in a state where the power source voltage is sufficiently stable, or even when the latch circuit is in operation, the restore operation can be performed in an extremely stable and reliable manner. The specific values of the above-described Vr, the voltage value at each node, and the mirror ratio of a current mirror circuit are just examples, and it is needless to say that these values are optimized in accordance with the characteristics of the variable resistance element 1 and the environmental conditions of the semiconductor process.

Figure 10:
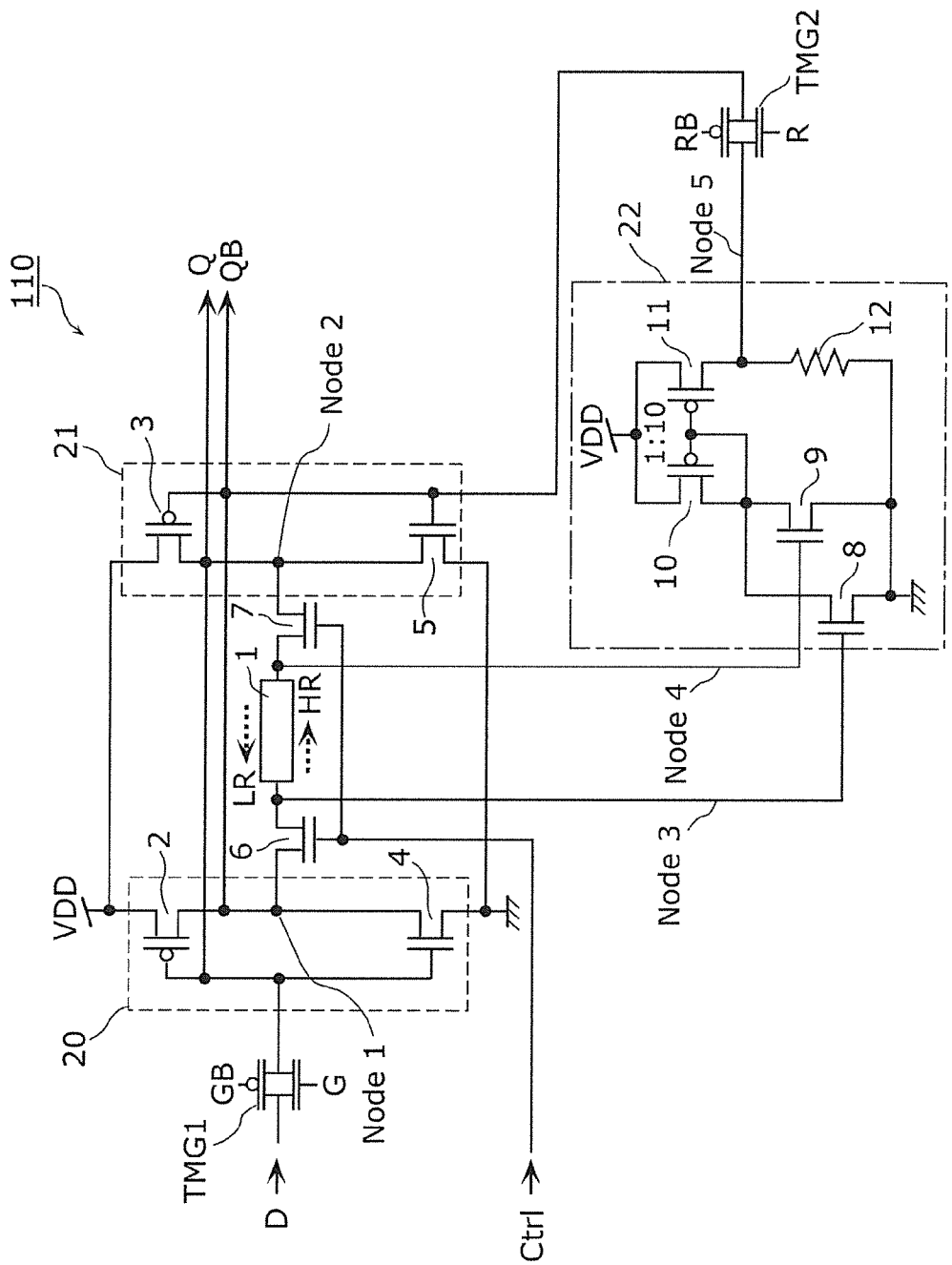
FIG. 10 is a circuit configuration diagram of a nonvolatile latch circuit illustrating a modification of Embodiment 1 of the present invention.

FIG. 10 is a circuit configuration diagram of a nonvolatile latch circuit illustrating a modification of Embodiment 1 of the present invention. The nonvolatile latch circuit 110 illustrated in FIG. 10 differs from the nonvolatile latch circuit 110 of FIG. 3 in the connection direction of the variable resistance element 1, and the connection destination of the output terminal of the summing amplifier circuit 22. Specifically, the variable resistance element 1 changes to LR state (changes to a low resistance state) with the current flow in the direction from node 2 to node 1, and changes to HR state (changes to a high resistance state) with the current flow in the direction from node 1 to node 2. Accordingly, the logic state of the latch operating unit which is restored from the resistance state of the variable resistance element 1 is inverted to the logic state illustrated in FIGS. 9A to 9D, and thus the output terminal of the summing amplifier circuit 22 is connected to the input terminal of the inverter circuit 21, and the output terminal of the inverter circuit 20 via the transmission gate TMG2. The present configuration also provides the same effect as that provided by the nonvolatile latch circuit 100 illustrated in FIG. 3. That is to say, regardless of any combination in the above-mentioned four types of combinations, when the variable resistance element is in HR state, node 1 (the third node) is restored to a High level, and node 2 (the fourth node) is restored to a Low level. On the other hand, when the variable resistance element is in LR state, node 1 (the third node) is restored to a Low level, and node 2 (the fourth node) is restored to a High level. Accordingly, even when the direction of a resistance change is different from the direction in FIG. 3, the summing amplifier circuit 22 stably restores the logic state of the latch operating unit including the inverter circuits 20 and 21 from the resistance state stored in the variable resistance element 1.

[Layout of Variable Resistance Element]

Figure 11A:
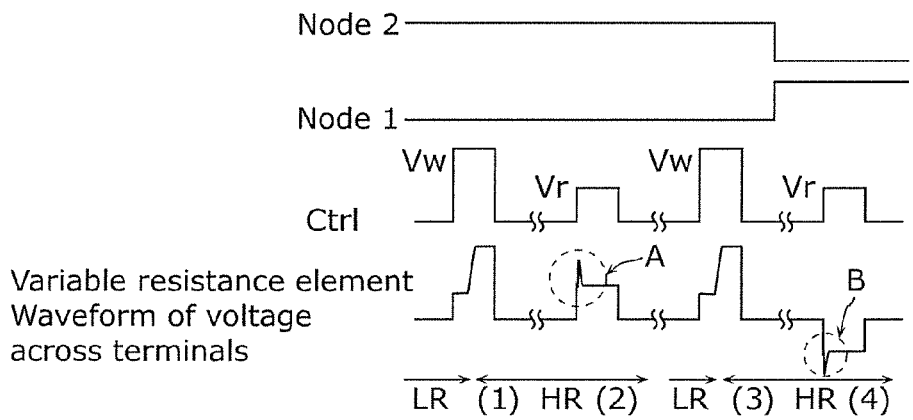
FIG. 11A is a waveform diagram of the voltage amplitude generated in the variable resistance element in HR writing step and HR reading step in a configuration where a wiring capacitance C2 of node 4 is greater than a wiring capacitance C1 of node 3.
Figure 11B:
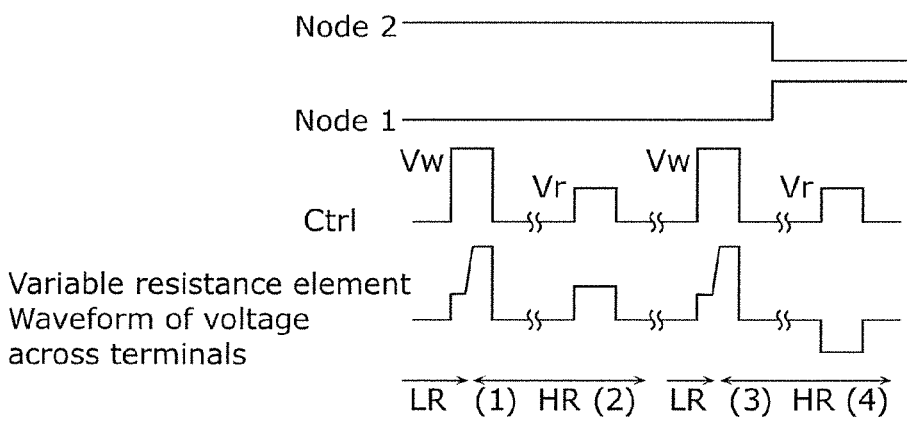
FIG. 11B is a waveform diagram of the voltage amplitude generated in the variable resistance element in HR writing step and HR reading step in a configuration where the wiring capacitance C2 of node 4 is smaller than or equal to the wiring capacitance C1 of node 3.
Figure 11C:
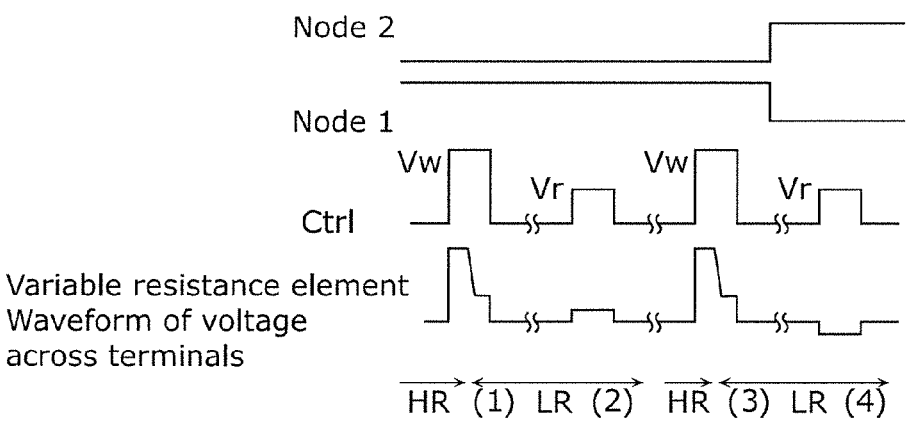
FIG. 11C is a waveform diagram of the voltage amplitude generated in the variable resistance element in LR writing step and LR reading step in a configuration where there is no relationship between the wiring capacitance C2 of node 4 and the wiring capacitance C1 of node 3.

Next, optimization of the layout of the variable resistance element 1 and the transistors 6, 7 in the present invention will be described. FIG. 11A is a waveform diagram of the voltage amplitude generated in the variable resistance element in HR writing step and HR reading step in a configuration where a wiring capacitance C2 of node 4 is greater than a wiring capacitance C1 of node 3. FIG. 11B is a waveform diagram of the voltage amplitude generated in the variable resistance element in HR writing step and HR reading step in a configuration where the wiring capacitance C2 of node 4 is smaller than or equal to the wiring capacitance C1 of node 3. FIG. 11C is a waveform diagram of the voltage amplitude generated in the variable resistance element in LR writing step and LR reading step. This is an example of the case where no failure occurs regardless the relationship between the wiring capacitance C2 of node 4 and the wiring capacitance C1 of node 3. Specifically, FIG. 11A and FIG. 11B each illustrates a waveform chart of the voltage across both ends of the variable resistance element 1 when the following operations are performed in the configuration of the nonvolatile latch circuit 100 illustrated in FIG. 3: (1) HR writing is performed in the logic state where node 2 is at a High level and node 1 is at a Low level; (2) Reading operation is performed in the same logic state; (3) HR writing is further performed; and (4) Reading operation is performed in the logic state where node 2 is at a Low level and node 1 is at a High level. Note that FIG. 11A illustrates the case where the parasitic capacitance C2 of node 4 is greater than the parasitic capacitance C1 of node 3, On the other hand, FIG. 11B illustrates the case where C2 is less than or equal to C1. FIG. 11C illustrates a waveform chart of the voltage across both ends of the variable resistance element 1 when the following operations are performed in the configuration of the nonvolatile latch circuit 100 illustrated in FIG. 3: (1) LR writing is performed in the logic state where node 2 is at a Low level and node 1 is at a High level; (2) Reading operation is performed in the same logic state; (3) LR writing is further performed; and (4) Reading operation is performed in the logic state where node 2 is at a High level and node 1 is at a Low level. In the state where LR writing is performed to the variable resistance element, a difference between the voltages at both ends of the variable resistance element 1 is hardly caused by the relationship between C1 and C2, and thus regardless the relationship between C1 and C2, noise causing a malfunction is not generated in LR reading step.

As is apparent from FIG. 11A, noise occurs which causes an overshoot of the waveform of the voltage across both ends of variable resistance element 1 in HR read operation when C2>C1. In particular, like the noise surrounded by dashed lines A, B in FIG. 11A, large noise may be applied to a variable resistance element so that the variable resistance element in HR state may be changed to LR state, and thus there is a concern that a malfunction (read disturb) causing a change from HR state to LR state may occur. On the other hand, the above-described noise is not generated in FIGS. 11B and 11C. That is to say, occurrence of the above-mentioned noise can be avoided by adopting a circuit configuration of layout such that C2≦C1.

Figure 13:
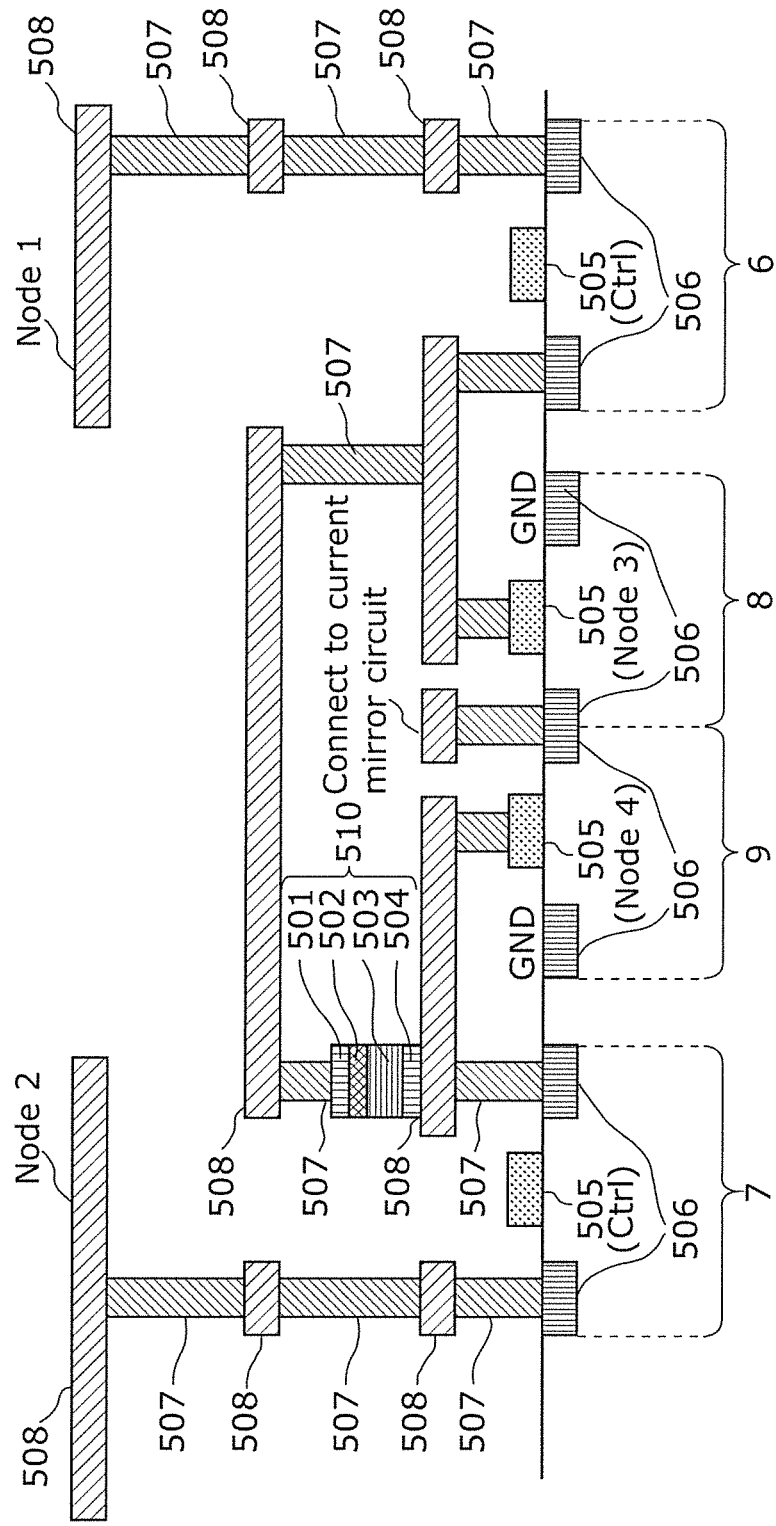
FIG. 13 is a layout diagram for suppressing occurrence of noise in the case where a variable resistance element is used which changes to HR state when a voltage is applied to cause a current to flow in the direction from the lower electrode to the upper electrode.

An example of the layout of variable resistance elements is illustrated in FIGS. 12 and 13 in consideration of the above-described relationship between the wiring capacitance C2 of node 4 and the wiring capacitance C1 of node 3.

FIG. 12 is a layout diagram for suppressing occurrence of noise in the case where a variable resistance element is used which changes to HR state when a voltage is applied to cause a current to flow in the direction from an upper electrode to a lower electrode. FIG. 13 is a layout diagram for suppressing occurrence of noise in the case where a variable resistance element is used which changes to HR state when a voltage is applied to cause a current to flow in the direction from the lower electrode to the upper electrode. In FIGS. 12 and 13, the components labeled with the same symbols as those in FIG. 1 indicate the same components.

Similarly to FIG. 1, in FIG. 12, there is disposed the variable resistance element 500 having an element structure in which the first electrode layer 501, the first variable resistance layer 502, the second variable resistance layer 503, and the second electrode layer 504 are stacked on the semiconductor substrate in this order. As already described, the variable resistance element 500 used in the present embodiment changes to a high resistance state (HR) by applying a voltage exceeding a predetermined value so as to cause a current to flow from the second electrode layer 504, i.e., an upper electrode in contact with the second variable resistance layer 503 to the first electrode layer 501, i.e., a lower electrode. The variable resistance element 500 changes to a low resistance state (LR) under voltage application in the reverse direction.

On the other hand, in FIG. 13, there is disposed a variable resistance element 510 having an element structure in which the second electrode layer 504, the second variable resistance layer 503, the first variable resistance layer 502, and the first electrode layer 501 are stacked on the semiconductor substrate in the reverse order. Because the direction of a resistance change is determined in the manner as in the variable resistance element 500, the variable resistance element 510 changes to a high resistance state (HR) by applying a voltage exceeding a predetermined value so as to cause a current to flow from the second electrode layer 504, i.e., a lower electrode in contact with the second variable resistance layer 503 to the first electrode layer 501 i.e., an upper electrode. The variable resistance element 510 changes to a low resistance state (LR) under voltage application in the reverse direction. The layouts illustrated in FIGS. 12 and 13 are both designed so that the wiring layout of node 4 as a connection from the second electrode layer 504 to the transistors 7 and 9 is the shortest. On the other hand, the wiring layout of node 3 as a connection from the first electrode layer 501 to the transistors 8 and 6 is longer than the wiring layout of node 4. That is to say, the length of the wiring connected to node 4 is set to be shorter than the length of the wiring connected to node 3. In accordance with the relationship between the wire lengths, occurrence of the above-mentioned noise is suppressed by designing an layout so that the parasitic capacitance C2 of node 4 is less than or equal to the parasitic capacitance C1 of node 3, in other words, the parasitic capacitance C1 of node 3 is greater than or equal to the parasitic capacitance C2 of node 4.

The above-mentioned layout design can be achieved by setting the capacitance of the wiring connected to node 3 to be greater than or equal to the capacitance of the wiring connected to node 3. However, instead of specifying the length relationship between the wire lengths, a capacitive load such as a capacitive element, for example, may be disposed between node 3 and the ground terminal. With this technique, the capacitance of node 3 can be made greater than or equal to the capacitance of node 4.

In the layout example in FIGS. 12 and 13, the direction of a resistance change of the variable resistance element is defined by the second oxide layer and the electrode connected to the second oxide layer, however the definition is not limited to this. For example, even when the oxide layer is not two-layered, but a single-layered unlike the present embodiment, the direction of a resistance change can be defined using an electrode composed of a material with a high standard electrode potential, and another electrode composed of a material with a standard electrode potential lower than that of the above electrode. That is to say, a similar resistance change is obtained by using a material with a high standard electrode potential as the material of the second electrode layer 504 in FIGS. 12 and 13, and using a material with a low standard electrode potential as the material of the first electrode layer 501. That is to say, the restriction to the layout according to the present invention is to design the variable resistance element so as to reduce the parasitic capacitance added to the second electrode layer 504 to be smaller than the parasitic capacitance added to the first electrode layer 501 as much as possible when a current is caused to flow from the second electrode layer 504 to the first electrode layer 501 in order to change the variable resistance element to a high resistance state. Thus, in this configuration, even when a restore operation is performed to restore the state of the latch circuit after writing HR state to the variable resistance element, noise which causes the variable resistance element in HR state to change to LR state does not occur, and thus a nonvolatile latch circuit with high reliability in data storage can be provided.

Thus, according to the present embodiment, the latch operating unit including the inverter circuits 20 and 21, and the state storage unit including the transistors 6 and 7 and the variable resistance element 1 are electrically separated from each other by setting the gate terminals of the transistors 6 and 7 to GND potential for example so that the latch operating unit can operate independently of the state storage unit. Therefore, the operation speed of each latch operation can be as high as the operation speed of a single latch circuit having no state storage unit. When a writing voltage is applied to the gate terminal to drive the variable resistance element 1 under the condition of the logic state of the latch operating unit such that node 1 is at a High level, and node 2 is at a Low level, the transistor 6 serves as a current steering element. When a writing voltage is applied to the gate terminal to drive the variable resistance element 1 under the condition that node 1 is at a Low level, and node 2 is at a High level, the transistor 7 serves as a current steering element. Consequently, rewrite to the variable resistance element 1 is not performed for each latch operation, and necessary voltage is applied for a time as needed in rewriting step, and thus stable rewrite operation can be achieved. In addition, because a plurality of variable resistance elements is not connected in series but a single variable resistance element is used for storing the logic state of each latch circuit, the rewriting voltage can be reduced.

In addition, a transitional period during which power source start-up is unstable is not used when the previous latch state is restored from the resistance state of the variable resistance element 1. In addition, because a low voltage which has less stress and is necessary for reading is applied for a time as needed, extremely stable restore operation can be achieved.

When the variable resistance element 1 is caused to change from LR to HR, the transistor 7 operates as a load resistance, and when the variable resistance element 1 is caused to change from HR to LR, the transistor 6 operates as a load resistance. Although the same voltage is inputted to the gate terminals of the transistors 6 and 7, the on-resistance of the transistor 6 is greater than the on-resistance of the transistor 7 because of the difference between the gate widths (Wa<Wb). Therefore, abnormally low resistance value beyond the drive capability of the transistor 7 can be prevented from being written to the variable resistance element. Therefore, the variable resistance element 1 in LR state can be changed to HR state without fail by the transistor 7. Consequently, it is possible to provide the nonvolatile latch circuit 100 which stably maintains favorable resistance change operation with extremely high reliability of store operation.

In addition, by setting the condition that the parasitic capacitance C1 of node 3>=the parasitic capacitance C2 of node 4, occurrence of noise can be suppressed, which may cause an overshoot of the waveform of the voltage across both ends of the variable resistance element in HR reading step. Consequently, a malfunction causing a change from HR state to LR state can be prevented, and stable operation of restoring logic state can be achieved.

The variable resistance element 1 which is added in order to provide a nonvolatile function is composed of an oxygen-deficient tantalum oxide. Tantalum (Ta) is a proven material that is used in semiconductor process as a nitride TaN, an oxide $Ta_2O_5$, or the like, and has a high compatibility with CMOS process. Particularly, the oxygen-deficient tantalum oxide $TaO_x$ (0<x<2.5) can be formed by processing in a room temperature or a relatively low temperature. That is to say, the process of forming the variable resistance element 1 does not involve a heat process that requires a high processing temperature, and thus the performance of transistors is not impaired. In addition, a memory cell array region for recording logic states does not need to be formed separately from a logic circuit region. Consequently, after the transistors that constitute the logic circuit are formed on a semiconductor substrate, a variable resistance element 1 can be formed on part of the wiring layer of plug contact, and thus the integration and fine forming in the logic circuit are not impaired.

[Embodiment 2]

Next, Embodiment 2 of the present invention will be described with reference to FIGS. 14 to 16.

Figure 14:
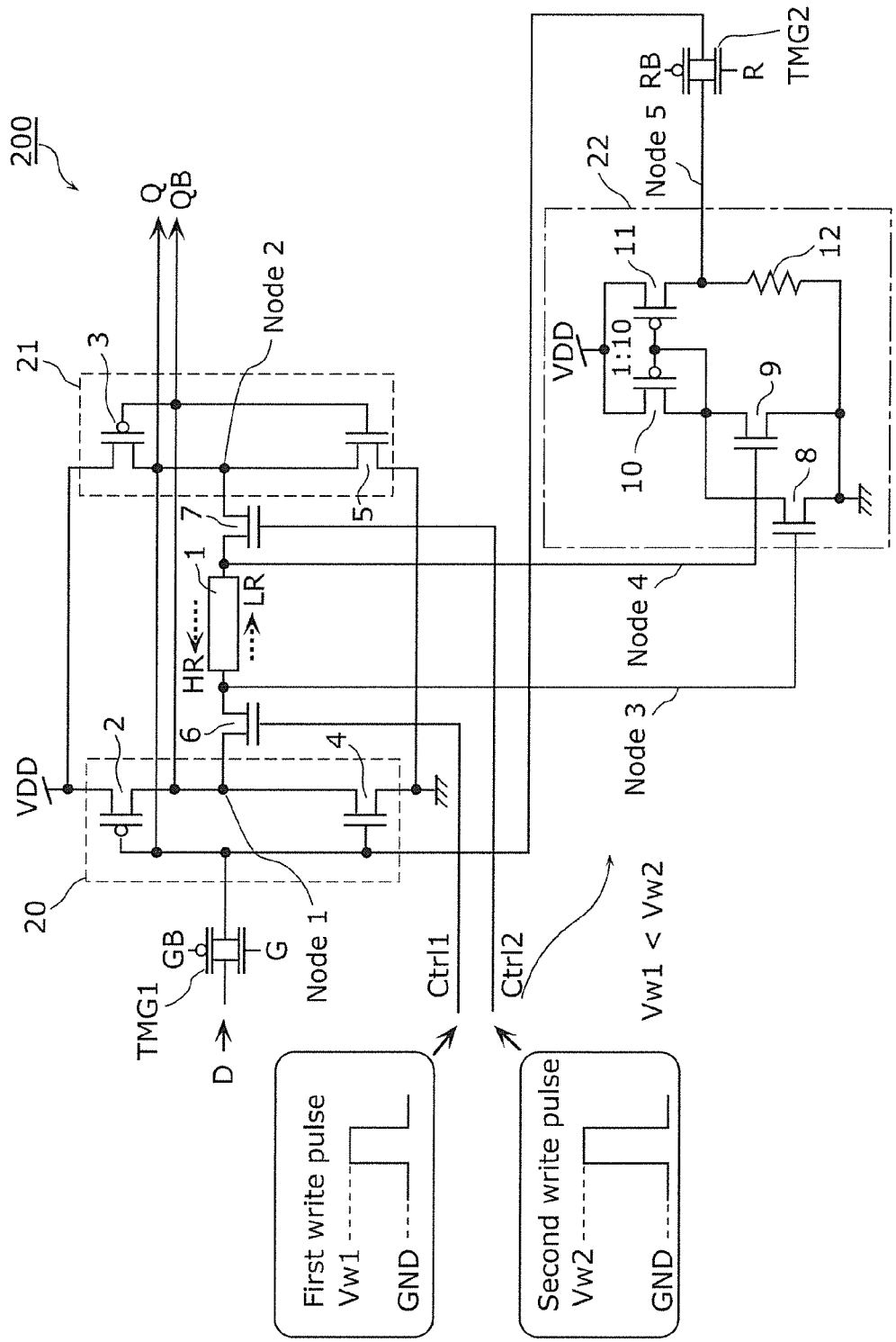
FIG. 14 is a circuit configuration diagram of a nonvolatile latch circuit according to Embodiment 2 of the present invention.
Figure 15A:
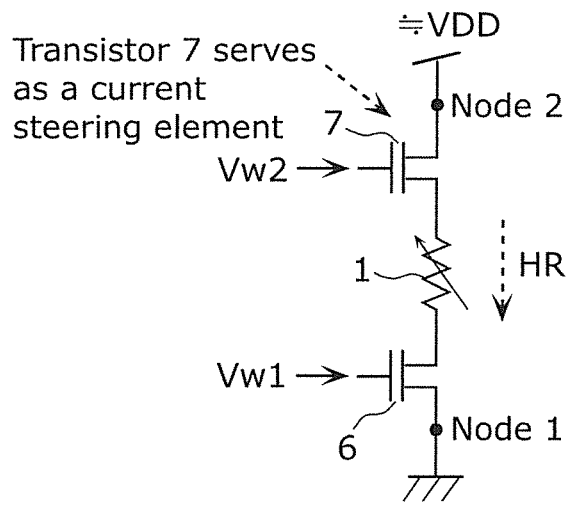
FIG. 15A is a circuit diagram illustrating an HR write operation to a variable resistance element according to Embodiment 2 of the present invention.
Figure 15B:
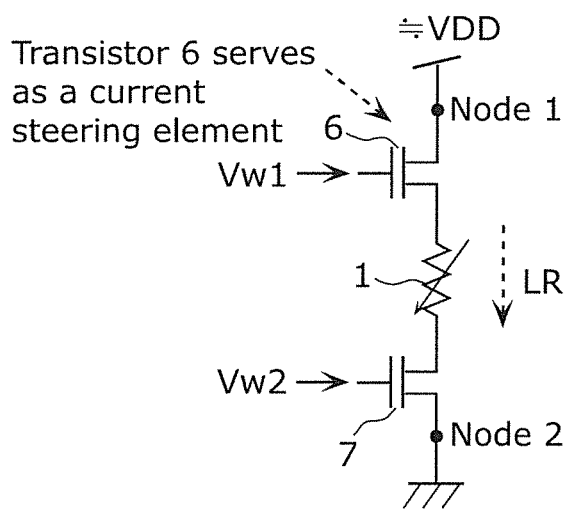
FIG. 15B is a circuit diagram illustrating an LR write operation to the variable resistance element according to Embodiment 2 of the present invention.

FIG. 14 is a circuit configuration diagram of a nonvolatile latch circuit according to Embodiment 2 of the present invention. In FIG. 14, FIGS. 15A and 15B, the components labeled with the same symbols as those in FIG. 3 indicate the same components. However, the gate widths of the transistors 6 and 7 are assumed to be the same as described below. The nonvolatile latch circuit 200 according to the present embodiment differs from the nonvolatile latch circuit 100 illustrated in FIG. 3 in that the control signal Ctrl1 to be inputted to the gate of the transistor 6, and the control signal Ctrl2 to be inputted to the transistor 7 are separately inputted.

As described in Embodiment 1, it is preferable to limit the current flow for a change to LR state to be less than the current flow for a change to HR state. In Embodiment 1, the above limitation is achieved by setting the gate width Wb of the transistor 7 to be greater than the gate width Wa of the transistor 6, however, in the present embodiment, the gate widths of the transistors 6 and 7 are assumed to be the same.

In the store operation of the nonvolatile latch circuit 200 according to the present embodiment, a first write pulse with a voltage amplitude of Vw1 is applied to the gate terminal of the transistor 6 where the absolute value of Vw1 is larger than that of the first voltage and the second voltage, and at the same time, a second write pulse with a voltage amplitude of Vw2 is applied to the gate terminal of the transistor 7 where the absolute value of Vw2 is larger than that of the first voltage and the second voltage. Here, the control signals Ctrl1 and Ctrl2 to be applied have the relationship of Vw1<Vw2. The above-mentioned first write pulse and the second write pulse are generated, for example, by a write circuit included in the nonvolatile latch circuit 200, and are outputted to the above-mentioned Ctrl1 terminal and Ctrl2 terminal from the write circuit. Then the first write voltage and the second write voltage are applied to the gate terminals of the transistors 6 and 7 for a certain time period with the above-mentioned first write pulse and second write pulse.

FIG. 15A is a circuit diagram illustrating an HR write operation to a variable resistance element according to Embodiment 2 of the present invention. FIG. 15B is a circuit diagram illustrating an LR write operation to the variable resistance element according to Embodiment 2 of the present invention.

FIG. 15A illustrates a state where node 1 is latched to a Low voltage and node 2 is latched to a High voltage, while FIG. 15B illustrates a state where node 1 is latched to a High voltage and node 2 is latched to a Low voltage. In both FIGS. 15A and 15B, the first write voltage with the voltage amplitude of Vw1 is applied to the gate terminal of the transistor 6, and the second write voltage with the voltage amplitude of Vw2 is applied to the gate terminal of the transistor 7. Then, in FIG. 15A, a pulse with a voltage amplitude is applied to the variable resistance element 1 where the voltage amplitude has reduced from Vw2 by the threshold voltage Vt of the transistors, a current flows in the direction from node 2 to node 1, and thus the variable resistance element 1 changes to HR. On the other hand, in FIG. 15B, a pulse with a voltage amplitude is applied to the variable resistance element 1 where the voltage amplitude has reduced from Vw1 by the threshold voltage Vt of the transistors, a current flows in the direction from node 1 to node 2, and thus the variable resistance element 1 changes to LR. In the above step, the voltage across both ends of the variable resistance element 1 when changing to LR is smaller than the voltage when changing to HR, and the current amount for changing to LR equivalently is more limited than the current amount for changing to HR. This will be described in detail with reference to FIG. 16.

Figure 16:
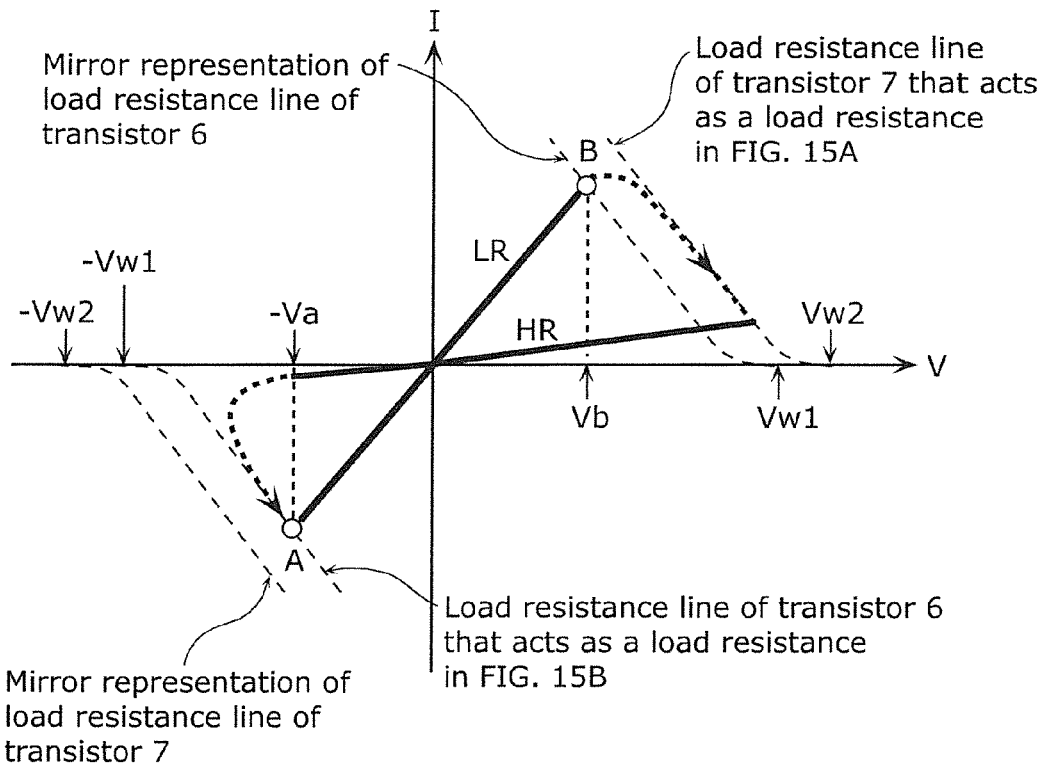
FIG. 16 is a graph in which a load resistance line of each transistor through which current flow is limited is superimposed on the current-voltage characteristics of the variable resistance element.

FIG. 16 is a graph in which a load resistance line of each transistor through which current flow is limited is superimposed on the current-voltage characteristics of the variable resistance element.

In FIG. 15A, a value nearly the power source voltage VDD, which corresponds to a High voltage is applied to the drain (node 2) of the transistor 7. On the other hand, a value nearly the ground level (GND), which corresponds to a Low voltage is applied to the source (node 1) of the transistor 6. That is to say, the transistor 7 operates as a source follower circuit of the variable resistance element 1, and therefore, even when the voltage amplitude Vw2 applied to the gate terminal of the transistor 7 is somewhat greater than the voltage amplitude Vw1 applied to the gate terminal of the transistor 6, the current drive capability of the transistor 7 becomes lower than that of the transistor 6 which operates with the source being grounded, because of the back bias effect of the transistors. That is to say, in HR state change of the variable resistance element 1 illustrated in FIG. 15A, the current which flows through the element is determined by the drive capability of the transistor 7. On the contrary, in FIG. 15B, a value nearly the power source voltage VDD, which corresponds to a High voltage is applied to the drain (node 1) of the transistor 6. On the other hand, a value nearly the ground level (GND), which corresponds to a Low voltage is applied to the source (node 2) of the transistor 7. That is to say, the transistor 6 operates as a source follower circuit of the variable resistance element 1, and therefore, the current drive capability of the transistor 6 becomes lower than that of the transistor 7 which operates with the source being grounded. That is to say, in LR state change of the variable resistance element 1 illustrated in FIG. 15B, the current which flows through the element is determined by the drive capability of the transistor 6.

As described above, when the variable resistance element 1 is caused to change from LR state to HR state, the voltage level that can be applied to the variable resistance element 1 in LR state is limited by the drive capability of the transistor 7.

Conversely, the variable resistance element 1 is caused to change from HR state to LR state, the voltage level that can be applied to the variable resistance element 1 in LR state after the change is limited by the drive capability of the transistor 6.

The current-voltage characteristics in FIG. 16 is illustrated by assuming that the voltage application state in FIG. 15A is positive polarity, and the voltage application state in FIG. 15B is negative polarity. In FIG. 16, when the first predetermined voltage (|Va|) or higher is applied to both ends of the variable resistance element 1 in HR state, the variable resistance element 1 starts to change to LR. The resistance value in LR state in the above step is determined by a load resistance, and change to a low resistance state is stopped at an operating point A which is the intersection point between the load resistance line of the transistor 6 and V=Va so that the resistance value is determined. On the other hand, a change from LR state to HR state starts when the voltage across both ends of the resistance change element 1 exceeds the second predetermined voltage Vb of an operating point B.

In the case of the variable resistance element comprising an oxygen-deficient tantalum oxide which is used in Embodiment 2 of the present invention, the above-mentioned |Va| and |Vb| have an almost equal relationship. As described above, when the variable resistance element 1 is caused to change from LR state to HR state, the voltage to be applied to the variable resistance element 1 is determined by the drive capability of the transistor 7, however, a voltage greater than or equal to Vb can be applied to the variable resistance element 1 by setting the second write voltage applied to the gate terminal of the transistor 7 to be greater than the first write voltage applied to the gate terminal of the transistor 6. This may be understood by the fact that the load resistance line of the transistor 7 is shifted so as to pass through Vw2 and sufficiently exceeds the voltage of the operating point B compared with the mirror representation of the load resistance line of the transistor 6, that is point symmetric to the load resistance line of the transistor 6 around the origin as illustrated in FIG. 16.

As described above, according to the configuration of Embodiment 2 of the present invention, when the logic state of the latch operating unit is written to the variable resistance element 1, the transistor 7 operates as a current steering element for a change to HR state, and the transistor 6 operates as a current steering element for a change to LR state. Thus, even when the gate width (Wa) of the transistor 6 and the gate width (Wb) of the transistor 7 have an equal relationship, abnormally low resistance value beyond the drive capability of the transistor 7 can be prevented from being written to the variable resistance element 1 by setting the relationship of Vw1<Vw2 where Vw1 is the voltage amplitude of the gate terminal of the transistor 6, and Vw2 is the voltage amplitude of the gate terminal of the transistor 7. Therefore, the variable resistance element 1 in LR state can be changed to HR state without fail. Consequently, it is possible to provide a nonvolatile latch circuit which stably maintains favorable resistance change operation with extremely high reliability of store operation. In the present embodiment, an example has been shown, in which the gate terminal of the transistor 6 and the gate terminal of the transistor 7 are controlled as separate terminals, however the invention is not limited to this configuration. For example, a configuration may be adopted in which the gate terminals of the transistors 6 and 7 are combined to a common terminal, and the amplitude of a write voltage to be inputted to the common terminal is switched in accordance with a latch state, and is inputted.

[Embodiment 3]

Next, Embodiment 3 of the present invention will be described with reference to FIGS. 17A and 17B.

Figure 17A:
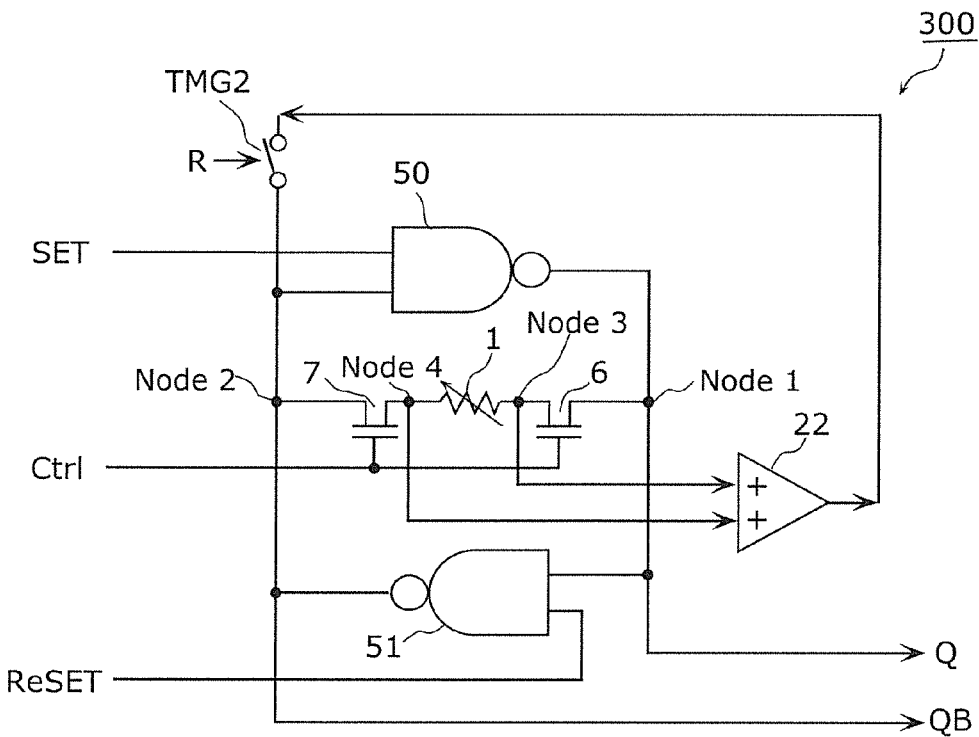
FIG. 17A is a circuit configuration diagram of a nonvolatile flip-flop circuit according to Embodiment 3 of the present invention.

FIG. 17A is a circuit configuration diagram of a nonvolatile flip-flop circuit according to Embodiment 3 of the present invention. FIG. 17B is a diagram illustrating a logic table of the nonvolatile flip-flop circuit according to Embodiment 3 of the present invention. In FIG. 17A, the components labeled with the same symbols as those in FIG. 4 indicate the same components. A nonvolatile flip-flop circuit 300 according to the present embodiment differs from the nonvolatile latch circuit 100 of FIG. 4 in that the inverter circuits 20 and 21 are replaced by NAND gate circuits 50 and 51 with 2 inputs.

As described in Embodiment 1, when an input to Ctrl terminal is GND level, and the transmission gate TMG2 is set to off, the transistors 6 and 7, the variable resistance element 1, and the summing amplifier circuit 22 are separated from NAND gate circuits 50 and 51. In the nonvolatile flip-flop circuit 300, NAND gate circuit 50 which is a first logic inversion circuit, and NAND gate circuit 51 which is a second logic inversion circuit constitute a latch operating unit. Specifically, cross-coupled connection is made such that the output terminal of NAND gate circuit 50 is connected to one input terminal of NAND gate circuit 51, and the output terminal of NAND gate circuit 51 is connected to one input terminal of NAND gate circuit 50 so that an SR (Set Reset) flip-flop is formed. Because an SR flip-flop circuit uses a general technique, detailed description is omitted. When the voltage amplitude of Ctrl terminal is 0 in the logic table illustrated in FIG. 17B, SR flip-flop circuit operates as a logic circuit. When SET terminal and ReSET terminal are both set to 1 in the above state, NAND gate circuits 50 and 51 each operate equivalently to an inverter circuit.

When a write voltage with a voltage amplitude of Vw is inputted to Ctrl terminal with the transmission gate TMG2 off, the state of the flip-flop at the moment is written to the variable resistance element 1, and the logic state of the flip-flop is stored. When a read voltage with a voltage amplitude of Vr is inputted to Ctrl terminal with the transmission gate TMG2 off, a voltage value of a High level or a Low level is restored in accordance with the resistance value of the variable resistance element 1 so that the logic state of the flip-flop returns to the previous state. The details of the store and restore is the same as those in Embodiment 1 where NAND gate circuits 50 and 51 are replaced by the inverter circuits 20 and 21, thus description is not repeated.

As described above, according to the configuration of Embodiment 3 of the present invention, a nonvolatile flip-flop circuit using the variable resistance element 1 with an extremely high speed and high reliability can be achieved. In addition, current limiting in writing step is performed properly when the state of a flip-flop is stored, and thus the store operation can be accurately performed without malfunction. The problem of needing two voltage sources for writing in the conventional art which uses two variable resistance elements can be solved by the configuration of the present invention which uses a single variable resistance element, and effects such as low power consumption of the circuit and a simplified power source circuit are provided.

In addition, the configuration which allows the gate terminals of the transistors 6 and 7 to be individually controlled as in Embodiment 2 can be also achieved by the present embodiment. In the present embodiment, the configuration using NAND gates have been illustrated, however the invention is not limited to this, and NAND gate circuits may be replaced by NOR gate circuits, for example.

Figures 17B, 18A:
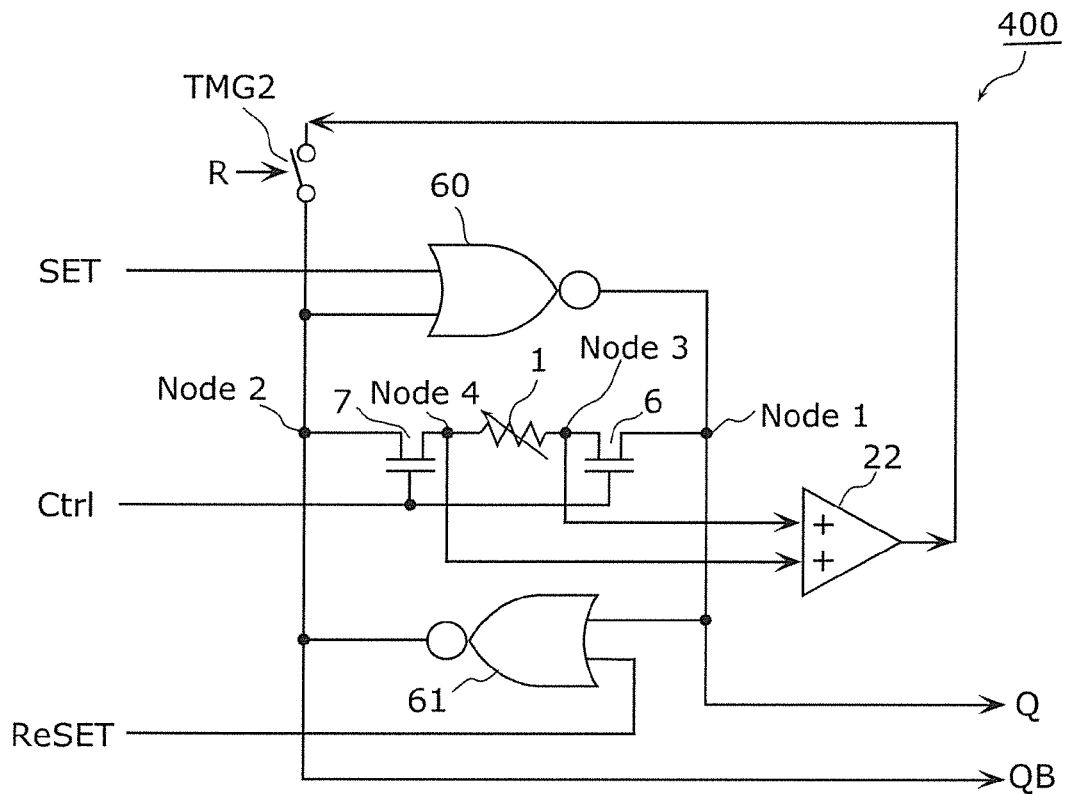
FIG. 17B is a diagram illustrating a logic table of the nonvolatile flip-flop circuit according to Embodiment 3 of the present invention.
FIG. 18A is a circuit configuration diagram of a nonvolatile flip-flop circuit showing a modification of Embodiment 3 of the present invention.
Figure 19A:
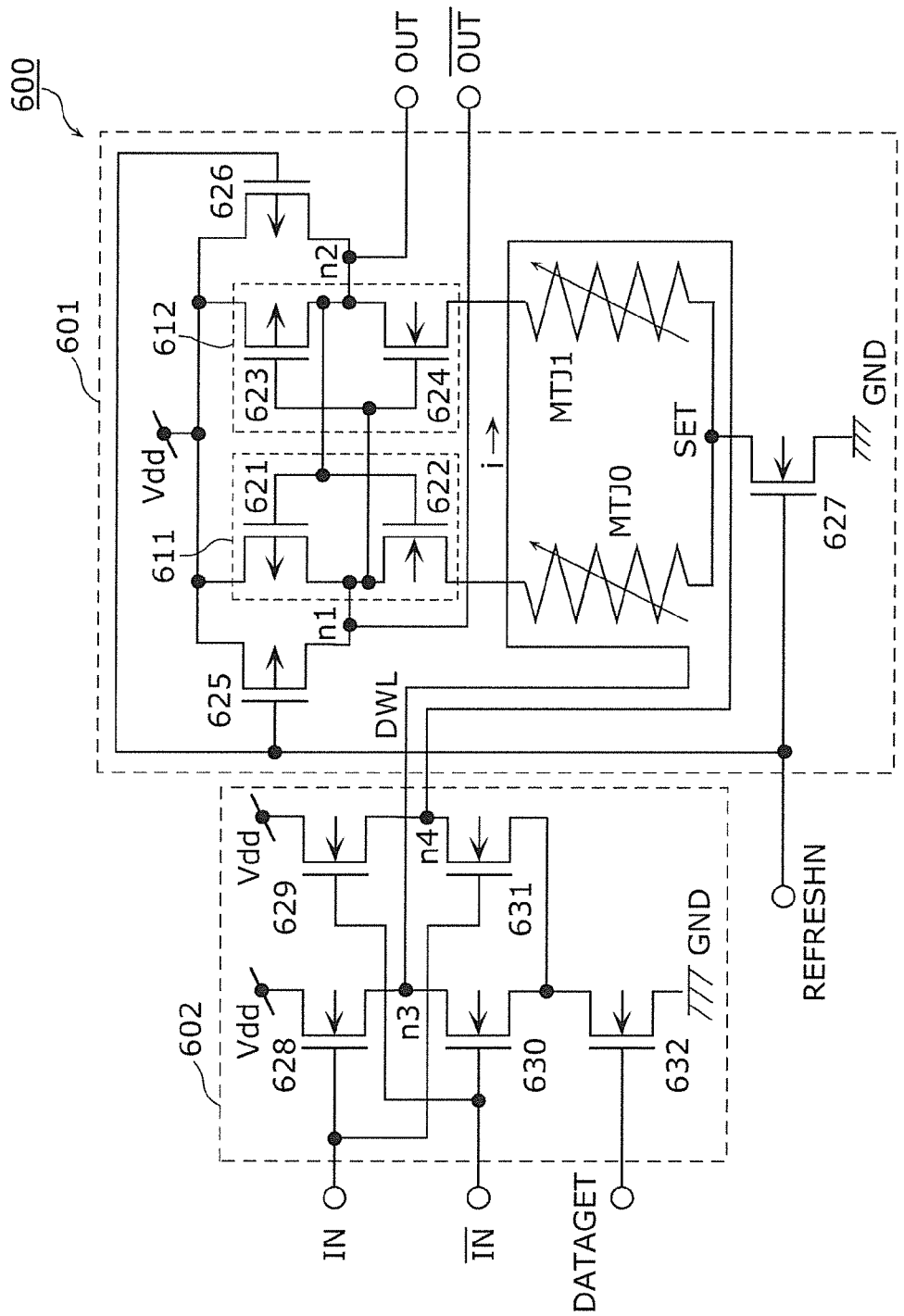
FIG. 19A is a circuit configuration diagram of a nonvolatile latch circuit according to a first conventional embodiment.
Figure 20:
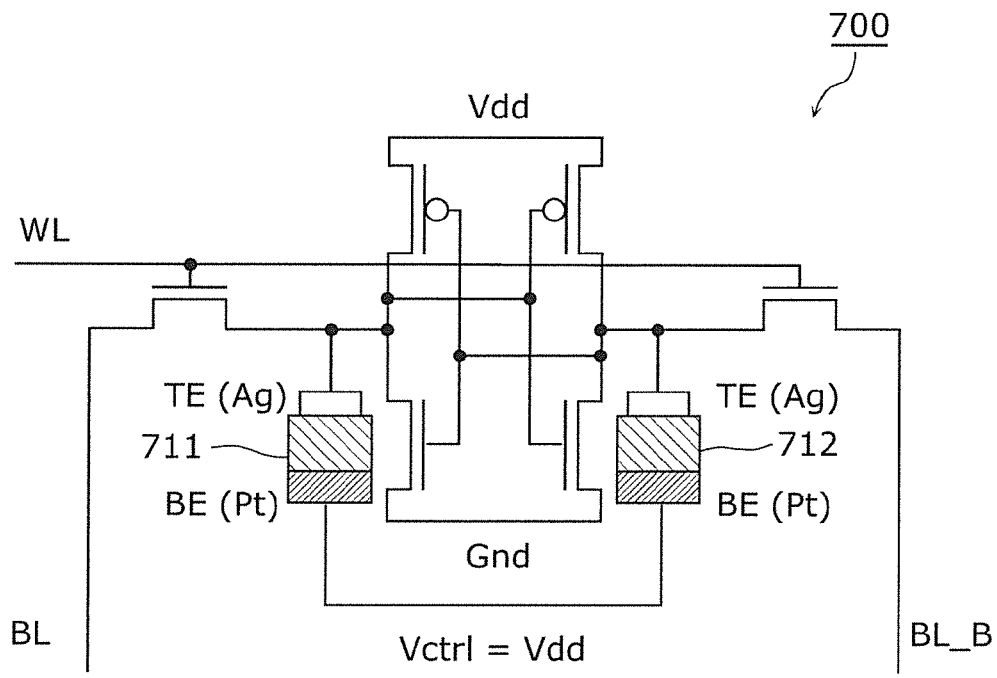
FIG. 20 is a circuit configuration diagram of a nonvolatile latch circuit according to a second conventional embodiment.
Figure 21:
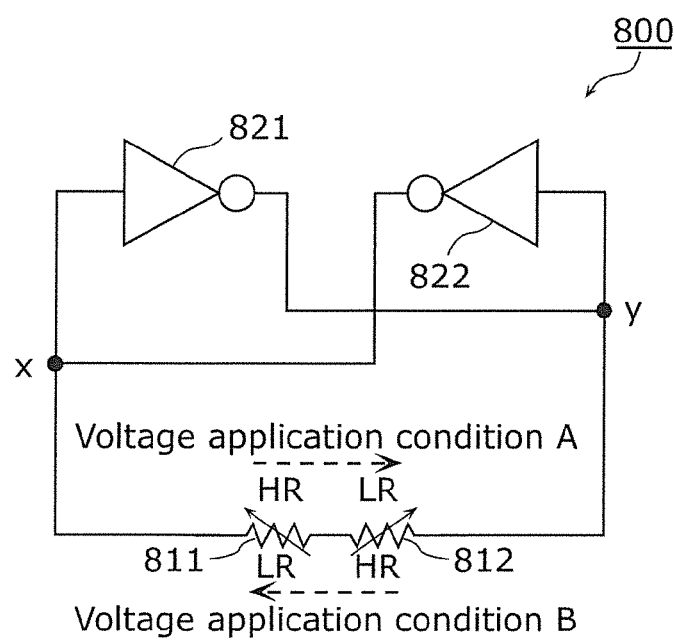
FIG. 21 is a circuit configuration image diagram illustrating a method of storing the state of a latch circuit according to the third conventional embodiment into a variable resistance element.
Figure 22:
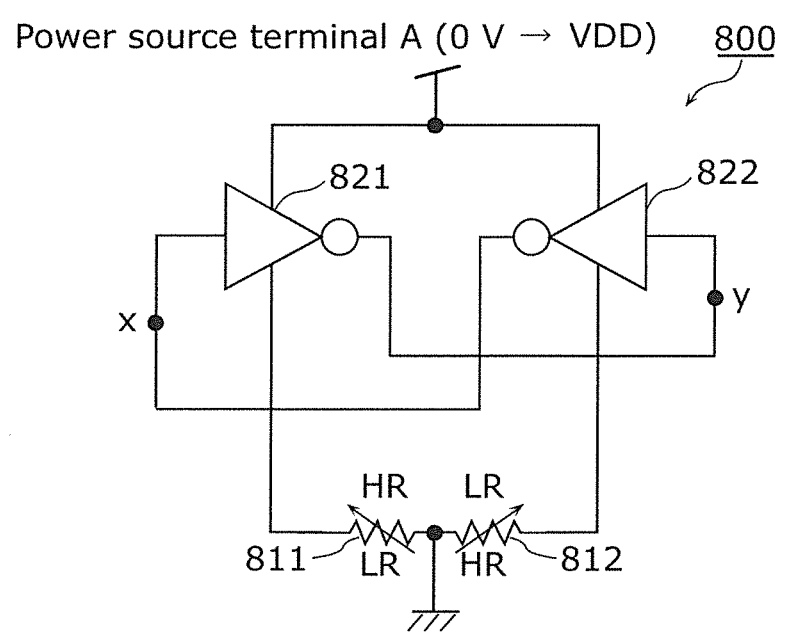
FIG. 22 is a circuit configuration diagram illustrating a method of restoring the previous latch state based on a resistance state stored in the variable resistance element in the latch circuit according to the third conventional embodiment.

FIG. 18A is a circuit configuration diagram of a nonvolatile flip-flop circuit showing a modification of Embodiment 3 of the present invention, and FIG. 18B is a diagram illustrating a logic table of a nonvolatile flip-flop circuit showing a modification of Embodiment 3 of the present invention. In the nonvolatile flip-flop circuit 400 illustrated in FIG. 18A, NOR gate circuit 60 which is the first logic inversion circuit, and NOR gate circuit 61 which is the second logic inversion circuit constitute the latch operating unit. Specifically, cross-coupled connection is made such that the output terminal of NOR gate circuit 60 is connected to one input terminal of NOR gate circuit 61, and the output terminal of NOR gate circuit 61 is connected to one input terminal of NOR gate circuit 60 so that an SR (Set Reset) flip-flop is formed. In the present modification, when the voltage amplitudes of SET and ReSET terminals are both 0, store and restore operations can be performed. The nonvolatile flip-flop circuit 400 described in the present modification also provides the same effects as those of the nonvolatile flip-flop circuit 300 shown in Embodiment 3.

The above-described SR flip-flop circuit is the basic of all types of flip-flop circuits, and therefore, application using the above nonvolatile flip-flop circuit can be made. For example, in the case of a master-slave D flip-flop, a nonvolatile D flip-flop circuit can be provided by using the above-mentioned nonvolatile flip-flop circuit as a master flip-flop.

So far, the nonvolatile latch circuit and the nonvolatile flip-flop circuit according to the present invention have been described based on Embodiments 1 to 3, however, the nonvolatile latch circuit and nonvolatile flip-flop circuit according to the present invention are not limited to the above-described Embodiments 1 to 3. In a scope not departing from the gist of the present invention, modifications to which various changes that occur to those skilled in the art are made, and various devices which include the nonvolatile latch circuit and the nonvolatile flip-flop circuit according to the present invention are also included in the scope of the present invention.

In each of the above-described embodiments, an oxide layer comprises stacked tantalum oxide layers, however, an oxide layer may comprise other stacked oxide layers as described in Embodiment 1. For example, an oxide layer may comprise stacked hafnium (Hf) oxide layers or stacked zirconium (Zr) oxide layers.

In the case where a stacked structure of hafnium oxide layers is used, under the assumption that a first hafnium oxide has a composition expressed as $HfO_x$ and a second hafnium oxide has a composition expressed as $HfO_y$, it is preferable that respective compositions approximately satisfy $0.9 \leq x \leq 1.6$, and $1.8 \leq y \leq 2.0$, and the thickness of the second hafnium oxide is 3 nm or greater and 4 nm or less.

In the case where a stacked structure of zirconium oxide layers is used, under the assumption that a first zirconium oxide has a composition expressed as $ZrO_x$ and a second zirconium oxide has a composition expressed as $ZrO_y$, it is preferable that respective compositions approximately satisfy $0.9 \leq x \leq 1.4$, and $1.9 \leq y \leq 2.0$, and the thickness of the second zirconium oxide is 1 nm or greater and 5 nm or less.

It is not necessary that the same transition metal is used in the stacked structure of an oxide layer, and the stacked structure may comprise a first transition metal oxide layer including a first oxygen-deficient transition metal, and a second transition metal oxide layer including a second transition metal which is different from the first transition metal where the resistance of the second transition metal oxide is higher than that of the first transition metal oxide.

The reason for using the above stacked layer structure in which the resistance of the second transition metal oxide is higher than that of the first transition metal oxide is that the voltage applied to the variable resistance element in rewriting step is efficiently applied to the second transition metal oxide so as to contribute to a resistance change.

The standard electrode potential of the second transition metal is preferably lower than the standard electrode potential of the first transition metal. The standard electrode potential indicates characteristics that the higher its value is, the more resistant to oxidation. This preferability is because the resistance can be changed in a more stable manner by using a transition metal oxide with a lower standard electrode potential as the second transition metal oxide with a higher resistance. For example, an oxygen-deficient tantalum oxide may be used for the first transition metal oxide layer, and $TiO_2$ may be used for the second transition metal oxide layer. By adopting such a configuration, a resistance operation change can be caused in a more stable manner.

As an oxide layer comprising a transition metal material, transition metal oxide layer such as tantalum oxide layer may be included, which is a main variable resistance layer causing a resistance change. In addition, a small quantity of other elements may be included, for example. A small quantity of other elements can be intentionally included by fine adjustment of a resistance value. The above case is also included in the scope of the present invention. For example, the resistance value of the variable resistance layer is increased by adding nitrogen thereto, thus the reactivity of the resistance change can be improved. Because transition metal material often has a plurality of oxidation states, transition metal can be used in a nonvolatile memory device by using the oxidation states for data storage.

INDUSTRIAL APPLICABILITY

The nonvolatile latch circuit and nonvolatile flip-flop circuit of the present invention can be applied to a nonvolatile system LSI, CPU, microprocessor, and electronic products for which the capability of fully restoring an operational state immediately before the power source is turned off is demanded, and thus is useful in industry.

REFERENCE SIGNS LIST 1, 500, 510, 711, 712, 811, 812 Variable resistance element
2, 3, 4, 5, 6, 7, 8, 9, 10, 11 Transistor
12 Resistance element
20, 21, 611, 612, 821, 822 Inverter circuit
22 Summing amplifier circuit
50, 51 NAND gate circuit
60, 61 NOR gate circuit
100, 110, 200, 600, 700, 800 Nonvolatile latch circuit
300, 400 Nonvolatile flip-flop circuit
501 First electrode layer
502 First variable resistance layer
503 Second variable resistance layer
504 Second electrode layer
505 Gate oxide layer
506 Source-drain region
507 Plug layer
508 Metal wiring layer
601 Sense latch circuit
602 Write current generation circuit
621, 623, 625, 626 P-type MOSFET
622, 624, 627, 628, 629, 630, 631, 632 N-type MOSFET
TMG1 Transmission gate
TMG2 Transmission gate

The invention claimed is:

1. A nonvolatile latch circuit comprising:
a first logic inversion circuit;
a second logic inversion circuit having an input terminal connected to an output terminal of said first logic inversion circuit and an output terminal connected to an input terminal of said first logic inversion circuit;
a first transistor which includes a first terminal, a second terminal, and a first control terminal, and controls a conduction state between the first terminal and the second terminal in accordance with a voltage of the first control terminal;
a second transistor which includes a third terminal, a fourth terminal, and a second control terminal, and controls a conduction state between the third terminal and the fourth terminal in accordance with a voltage of the second control terminal; and
a variable resistance element having a structure in which an oxide layer including an oxygen-deficient transition metal oxide is interposed between first and second electrodes,
wherein the first terminal of said first transistor and the first electrode of said variable resistance element are connected to each other via a first node, the fourth terminal of said second transistor and the second electrode of said variable resistance element are connected to each other via a second node,
the output terminal of said first logic inversion circuit and the second terminal of said first transistor are connected to each other via a third node, and the output terminal of said second logic inversion circuit and the third terminal of said second transistor are connected to each other via a fourth node,
said variable resistance element changes to a first resistance state under application of a voltage higher than a first predetermined voltage between the first electrode and the second electrode so as to cause a current to flow in a direction from the first electrode to the second electrode, and changes to a second resistance state having a resistance value larger than a resistance value of the first resistance state under application of a voltage higher than a second predetermined voltage between the first electrode and the second electrode so as to cause a current to flow in a direction from the second electrode to the first electrode, and
an absolute value of a first current that flows through said variable resistance element when said variable resistance element is caused to change from the second resistance state to the first resistance state is smaller than an absolute value of a second current that flows through said variable resistance element when said variable resistance element is caused to change from the first resistance state to the second resistance state.

2. The nonvolatile latch circuit according to claim 1, further comprising
a summing amplifier circuit which detects a value of a sum of a potential of the first node and a potential of the second node,
wherein when said variable resistance element changes from the second resistance state to the first resistance state, or changes from the first resistance state to the second resistance state, in the case where a read voltage which is smaller than a first write voltage and a second write voltage in absolute value is applied to the first control terminal and the second control terminal, said summing amplifier circuit outputs a high-level voltage or a low-level voltage which represents a logic state of a latch operating unit comprising the first and second logic inversion circuits, to the third node or the fourth node in accordance with the value of the sum so as to restore the logic state of the latch operating unit based on a resistance state stored in said variable resistance element, the first write voltage and the second write voltage indicating a voltage applied to the first control terminal and a voltage applied to the second control terminal, respectively.

3. The nonvolatile latch circuit according to claim 1, further comprising
a write circuit which applies a first write voltage to the first control terminal, and applies a second write voltage that is greater than the first write voltage in absolute value to the second control terminal when said variable resistance element is caused to change from the first resistance state to the second resistance state, or is caused to change from the second resistance state to the first resistance state.

4. The nonvolatile latch circuit according to claim 1, further comprising
a write circuit which applies a third write voltage to the first control terminal and the second control terminal when said variable resistance element is caused to change from the second resistance state to the first resistance state, and applies a fourth write voltage that is greater than the third write voltage in absolute value to the first control terminal and the second control terminal when said variable resistance element is caused to change from the first resistance state to the second resistance state.

5. The nonvolatile latch circuit according to claim 1, further comprising
a write circuit which applies a fifth write voltage to the first control terminal and the second control terminal when said variable resistance element is caused to change from the first resistance state to the second resistance state or is caused to change from the second resistance state to the first resistance state,
wherein a gate width of said first transistor is less than a gate width of said second transistor.

6. The nonvolatile latch circuit according to claim 1, wherein a capacitive load is connected between the first node and a ground terminal so that a value of a capacitive load connected to the first node is greater than or equal to a value of a capacitive load connected to the second node.

7. The nonvolatile latch circuit according to claim 1, wherein a length of wiring connected to the second node is less than or equal to a length of wiring connected to the first node.

8. The nonvolatile latch circuit according to claim 1, wherein the oxide layer includes a stacked structure of a first oxide layer comprising a first transition metal and a second oxide layer comprising a second transition metal, a degree of oxygen deficiency of the first oxide layer is greater than a degree of oxygen deficiency of the second oxide layer, the second electrode is in contact with the second oxide layer, and the first electrode is in contact with the first oxide layer.

9. The nonvolatile latch circuit according to claim 8, wherein the first oxide layer is a tantalum oxide layer having a composition expressed by $TaO_x$ where $0.8 \leq x \leq 1.9$.

10. The nonvolatile latch circuit according to claim 8,
wherein the second oxide layer is a second tantalum oxide layer having a composition expressed by $TaO_y$, where $2.1 \leq y$.

11. The nonvolatile latch circuit according to claim 1,
wherein a material of the second electrode is higher in standard electrode potential than a material of the first electrode.

12. A nonvolatile flip-flop circuit comprising
the nonvolatile latch circuit according to claim 1,
wherein said first and second logic inversion circuits are respectively first and second NAND gate circuits each including at least two input terminals,
an output terminal of the first NAND gate circuit and one of the input terminals of the second NAND gate circuit are connected to each other via the third node,
an output terminal of the second NAND gate circuit and one of the input terminals of the first NAND gate circuit are connected to each other via the fourth node, and
the output terminal of the first NAND gate circuit and the second terminal of said first transistor are connected to each other via the third node, and the output terminal of the second NAND gate circuit and the fourth terminal of said second transistor are connected to each other via the fourth node.

13. A nonvolatile flip-flop circuit comprising
the nonvolatile latch circuit according to claim 1,
wherein said first and second logic inversion circuits are respectively first and second NOR gate circuits each including at least two input terminals,
an output terminal of the first NOR gate circuit and one of the input terminals of the second NOR gate circuit are connected to each other via the third node,
an output terminal of the second NOR gate circuit and one of the input terminals of the first NOR gate circuit are connected to each other via the fourth node, and
the output terminal of the first NOR gate circuit and the second terminal of said first transistor are connected to each other via the third node, and the output terminal of the second NOR gate circuit and the fourth terminal of said second transistor are connected to each other via the fourth node.

\* \* \* \* \*